(12) United States Patent
Nysen et al.

(10) Patent No.: US 8,249,532 B2
(45) Date of Patent: Aug. 21, 2012

(54) RADIO COMMUNICATION APPARATUS

(75) Inventors: Paul A. Nysen, Bonsall, CA (US);
Chih-Chuan Yen, Escondido, CA (US)

(73) Assignee: Sierra Wireless, Inc., Richmond, British Columbia (CA)

( * ) Notice: Subject to any disclaimer, the term of this patent is extended or adjusted under 35 U.S.C. 154(b) by 686 days.

(21) Appl. No.: 12/380,597

(22) Filed: Feb. 27, 2009

(65) Prior Publication Data
US 2009/0225819 A1 Sep. 10, 2009

Related U.S. Application Data

(60) Provisional application No. 61/032,814, filed on Feb. 29, 2008.

(51) Int. Cl.
*H04B 1/04* (2006.01)
(52) U.S. Cl. .......................... 455/129; 455/557
(58) Field of Classification Search .................. 455/129, 455/557
See application file for complete search history.

(56) References Cited

U.S. PATENT DOCUMENTS

| | | | |
|---|---|---|---|
| 5,343,214 A | 8/1994 | Hadzoglou | |
| 5,475,606 A | 12/1995 | Muyshondt et al. | |
| 5,515,064 A | 5/1996 | Backnik et al. | |
| 5,867,131 A | 2/1999 | Camp et al. | |
| 6,157,344 A | 12/2000 | Bateman et al. | |
| 6,266,017 B1 | 7/2001 | Aloous | |
| 6,421,016 B1 | 7/2002 | Phillips et al. | |
| 6,469,681 B1 | 10/2002 | Jones et al. | |
| 6,522,291 B1 | 2/2003 | Noguchi et al. | |
| 6,605,775 B1 | 8/2003 | Seeber et al. | |
| 6,686,886 B2 | 2/2004 | Flint et al. | |
| 6,747,216 B2 | 6/2004 | Brist et al. | |
| 6,870,733 B2 | 3/2005 | Castell et al. | |
| 6,937,205 B2 | 8/2005 | Chou et al. | |
| 6,966,782 B2 | 11/2005 | Wang et al. | |
| 7,212,161 B2 | 5/2007 | Chen et al | |
| 7,230,571 B2 | 6/2007 | Gaucher et al. | |
| 7,991,433 B2 * | 8/2011 | Mellage et al. | ............... 455/557 |
| 2001/0054985 A1 | 12/2001 | Jones | |
| 2002/0000938 A1 | 1/2002 | Hoashi | |
| 2003/0227572 A1 | 12/2003 | Rowser | |
| 2004/0192419 A1 | 9/2004 | Chen | |
| 2004/0240191 A1 | 12/2004 | Arnold et al. | |
| 2007/0035452 A1 | 2/2007 | Lin et al. | |
| 2007/0044145 A1 | 2/2007 | Kurian et al. | |
| 2007/0152893 A1 | 7/2007 | Chiang | |
| 2009/0228608 A1 | 9/2009 | Nysen et al. | |

OTHER PUBLICATIONS

Belkin, "Wireless G USB Network Adapter" User Manual, copyright 2004, Belkin Corporation.
Harris, Edward C., "Getting the Most from Your Hand-Held Transceiver", copyright 1998, 1999 VARI.
"Universal Serial Bus Specification" Revision 2.0, Apr. 27, 2000, pp. 87-92, 102.

* cited by examiner

*Primary Examiner* — John Poos
(74) *Attorney, Agent, or Firm* — King & Spalding

(57) ABSTRACT

The present invention provides a radio communication apparatus for use with a host system. The host system includes an electromagnetic body which acts as a ground plane or counterpoise for the radio communication apparatus. The apparatus comprises an electronics system coupled to the host system, a radio module including a radio electromagnetic body and optionally a radio electronics system, a signal pathway operatively coupling the electronics system with the radio module, and a conductive enclosure. The conductive enclosure provides electromagnetic isolation of the signal pathway. The conductive enclosure is further configured, by inclusion of a wave trap, to impede electromagnetic coupling between the radio electromagnetic body and the host electromagnetic body via the conductive enclosure.

31 Claims, 14 Drawing Sheets

FLAT U TRAP

FLAT S TRAP

EDGE U TRAP

EDGE S TRAP

HELIX TRAP

DIRECT TRAP

RADIO COMMUNICATION APPARATUS

RELATED APPLICATIONS

This application claims priority to U.S. Provisional Patent Application No. 61/032,814 filed Feb. 29, 2008 and entitled "Radio Communication Apparatus." The complete disclosure of the above-identified priority application is hereby fully incorporated herein by reference.

FIELD OF THE INVENTION

The present invention pertains in general to radio communications systems and in particular to radio transceiver packages for coupling with an external system.

BACKGROUND OF THE INVENTION

In wireless, radio communications, many transceiver products are available which package a radio antenna along with the electronics necessary for its operation to provide convenient wireless, radio communications capabilities. For several reasons, such products are often subject to conflicting size requirements. For example, wireless transceivers for use with cellular telephones or personal computing devices must be conveniently sized for portability and user experience. However, depending on the radio operating frequencies and required signal strengths involved, the products must exceed a certain minimum size in order to accommodate a radio antenna of appropriate physical dimensions.

The limitations of conventional wireless transceiver products can be illustrated with particular respect to current wireless adapter systems, which provide plug-in wireless communications capabilities to a host system such as a laptop computer. Common wireless adapters of this type may operate for example similarly to a cellular telephone or wireless network adapter, having a wired data port for connection to a host system at one end and including a radio transceiver. Such wireless adapters can therefore be considered to include three distinct parts, a data port, an intermediate electronics package, and an antenna.

For example, a wireless adapter of this type can be connected to provide wireless capabilities to a host computer through a standard interface such as a PCI, PCMCIA, Express, Firewire or USB interface. In the case of PCI, PCMCIA and Express Card interfaces, the adapter electronics section is typically located or enclosed substantially within a slot of the host system, and the antennas are located on a portion of the adapter external to the slot. In the case of a USB interface, the adapter electronics and antenna are typically both contained in a package external to the host system since the USB interface is only a relatively small connection port. The wireless adapter can also comprise one or more movable antenna portions which can increase design flexibility, but such systems are still constrained by limitations such as described below.

A problem with the above design is that the radio antenna structure must be more or less completely contained within the wireless transceiver package. In the case of a monopole antenna, an antenna body within the package, such as a patch antenna, a whip or stubby antenna, or a planar inverted F antenna (PIFA), is radiated against a ground plane also contained within the package, for example the electronics ground plane connected through the data port to a host device. For example, United States Patent Application Publication Nos. 2007/0035452 and 2007/0044145 both describe a USB wireless adapter having an antenna radiating against an internal ground plane. In the case of a dipole antenna, two antenna bodies contained in the package radiate in combination. In each case, the dimensions of the antenna bodies and the effective antenna length are limited by the dimensions of the wireless transceiver package. Furthermore, the effective bandwidth of antennas constructed in this manner may be limited.

Another particular constraint in the design of wireless communications packages comprising both electronics and radiating antenna bodies is that grounded and/or shielded components are often required, both to facilitate operation of the electronics, and to provide isolation between the electronic components and the antenna. However, such grounded components can also operate for example as de-tuning and de-sensing elements for the antenna, thereby compromising antenna operation.

Another challenge for radio communications systems is in simultaneously satisfying demands for increased data transfer rates, smaller and more inexpensive systems, and increased complexity.

Therefore there is a need for a wireless communications system for coupling with an external system, such as a wireless adapter, that is not subject to one or more of the limitations of the prior art.

This background information is provided to reveal information believed by the applicant to be of possible relevance to the present invention. No admission is necessarily intended, nor should be construed, that any of the preceding information constitutes prior art against the present invention.

SUMMARY OF THE INVENTION

An object of the present invention is to provide a radio communication apparatus. In accordance with an aspect of the present invention, there is provided a radio communication apparatus for use with a host system, the host system including a host electromagnetic body, the apparatus comprising: an electronics system operatively coupled to the host system; a radio module including a radio electromagnetic body; a signal pathway operatively coupling the electronics system with the radio module; and a conductive enclosure configured to provide electromagnetic isolation between the signal pathway and the radio electromagnetic body, the conductive enclosure further configured to at least partially impede electromagnetic coupling between the radio electromagnetic body and the host electromagnetic body.

DETAILED DESCRIPTION OF THE INVENTION

Definitions

Figure 1:
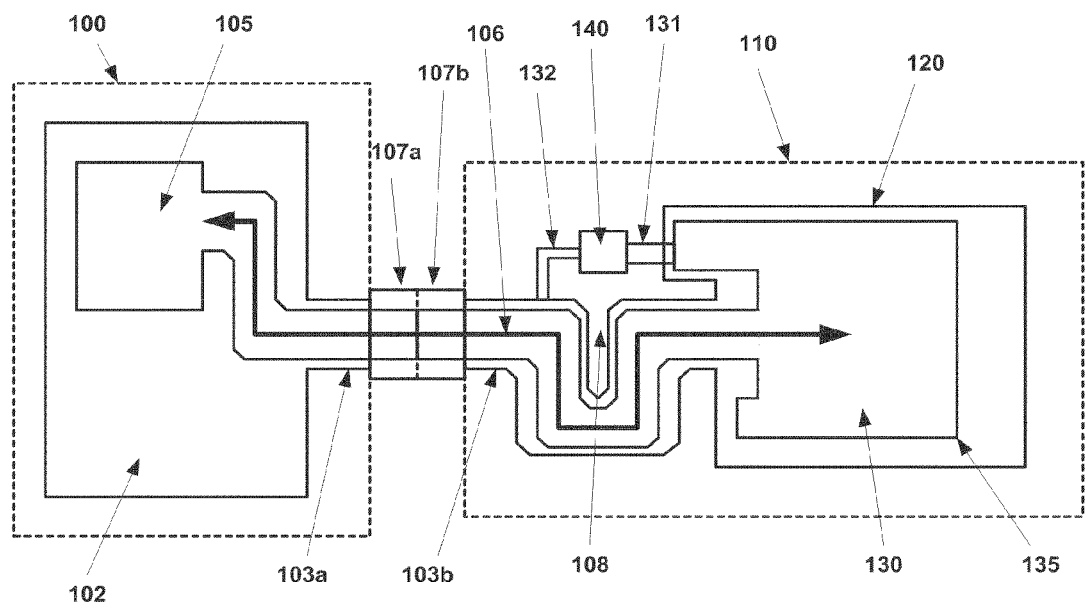
FIG. 1 illustrates a radio communication apparatus coupled to a host system in accordance with one embodiment of the invention.

The term "electromagnetic field" refers to an electric field, a magnetic field, or a combination thereof. More particularly, an electromagnetic field describes the strength of force interaction between stationary charged objects or moving charged objects at a distance. For example, an electromagnetic field can be employed to describe the interaction of antennas and/or other bodies in radio communications. As another example, electrical currents and voltages in a conducting body can be described in terms of electromagnetic fields within and around the conducting body. Electromagnetic fields can be either constant or time varying.

The terms "electromagnetic body", "radiating body", and "antenna" are used to define a conducting body, or outside skin or surface thereof, or arrangement of conducting bodies that radiates an electromagnetic field, as into free space, in response to an electrical or electromagnetic excitation applied thereto, or equivalently a conducting body or arrangement of conducting bodies that produces an electrical excitation in response to an electromagnetic field, whenever such an electromagnetic field and electrical excitation is significant to some purpose. Either or both of radio transmission and reception operations can be performed by an antenna.

The terms "ground plane" and "counterpoise" refer to an electromagnetic body or radiating body which acts in conjunction with another radiating body to form an antenna, wherein the ground plane or counterpoise is not directly coupled to an electronics system, but is electromagnetically coupled (interacting via an electromagnetic field) with the other radiating body through a relatively non-conductive material or free space. The radiating body and ground plane or counterpoise together comprise an antenna, the ground plane or counterpoise operating by passive electromagnetic reflection. A ground plane is generally a structure which enables operation of an antenna by providing an electromagnetic reference having desirable properties such as absorption and re-radiation, reflection, and/or scattering of electromagnetic radiation over a predetermined frequency range. A ground plane is not necessarily "earth ground." In a printed circuit board, a ground plane may for example comprise a layer of conductive material covering a substantial portion of the printed circuit board. A counterpoise, as generally defined in antenna systems, can be a structure which is used as a substitute for a ground plane, for example having a smaller size than an equivalent ground plane but with a strategically designed structure which enables the counterpoise to effectively emulate such a ground plane. A counterpoise may be regarded as a type of ground plane. A counterpoise may also provide a return current path for the antenna, and/or act as a counterbalance for the antenna feedpoint, thereby potentially reducing reflection of electromagnetic radiation back to the electronics.

The term "wave trap" is defined herein as an electrical or electromagnetic structure that blocks or at least impedes passage of a specified class of wanted or unwanted electrical or electromagnetic signals through the material of the wave trap. An example of a wave trap is a low-pass filter, which allows signals having a frequency below a given cut-off frequency to pass, while blocking signals having a frequency higher than the cut-off frequency. A wave trap may comprise a "U" shaped conductor having length about equal to an odd integer multiple of quarter wavelengths of an operating frequency. Alternatively, a wave trap may comprise an "S"-shaped, direct, or helically shaped portion having analogously defined dimensions. Other wave traps would be readily understood by a worker skilled in the art, for example a wave trap fashioned using isolated transformers, autotransformers, inductors, or capacitors, or a combination thereof. A wave trap can also be referred to as an isolator or a choke as it can function to isolate electrical or electromagnetic components by preventing electromagnetic coupling through the wave trap at one or more predetermined frequencies.

The terms "reactance", "resistance", "inductance", and "capacitance" are defined as characteristics of electrical impedance. In radio systems, it is known that many structures cannot be characterized by a single one of these terms, but may exhibit properties of several. It is understood that when such a term is used herein, it is meant to highlight a property of an electrical structure, without excluding the possibility that other properties may be present. Electrical impedance can be associated with the behaviour of electromagnetic fields within a structure, or alternatively with associated phenomena such as voltage and current.

The term "transceiver" is used to refer to a radio communication system that performs operations related to either or both of radio transmission and reception by leveraging electromagnetic coupling between antennas. A transceiver typically includes one or more antennas, and electronics operatively coupled to an antenna to translate between electromagnetic radiation in the antenna and a local analog or digital signal representative of data encoded into the electromagnetic radiation.

The term "Faraday cage" is used to refer to an electromagnetic enclosure for isolation of electrical components. A Faraday cage typically comprises several conductive surfaces, or surfaces having a mesh of conductive material, enclosing a shielded area. The Faraday cage is a conductive enclosure having two distinct types of surfaces, namely inside surfaces and outside surfaces. The conductive surfaces are configured to substantially block electric fields and electromagnetic radiation at selected frequencies, such that electromagnetic coupling, for example capacitive or inductive coupling, between elements interior to the Faraday cage and elements exterior to the Faraday cage is substantially reduced or eliminated and vice versa.

The term "modal diversity" is used herein to refer to an antenna property wherein an antenna can be excited or connected in different ways and/or at different locations, thereby generating distinct and nominally independent modes. Modal diversity can be used to generate distinct or different beam patterns and/or polarizations, as would be readily understood by a worker skilled in the art.

As used herein, the term "about" refers to a +/−20% variation from the nominal value. It is to be understood that such a variation is always included in a given value provided herein, whether or not it is specifically referred to.

Unless defined otherwise, all technical and scientific terms used herein have the same meaning as commonly understood by one of ordinary skill in the art to which this invention belongs.

The present invention provides a radio communication apparatus, such as a wireless adapter or radio transceiver, for connection to a host system. The host system, for example a computer, cellular telephone, computer peripheral, or personal digital assistant, includes a host electronics system which can provide functionality of the host system, and a host electromagnetic body, such as a ground plane or counterpoise. The radio communication apparatus comprises an electronics system operatively coupled to the host system and/or host electronics system. The electronics system may be integral to the apparatus itself or may be integral to the host system. The apparatus further comprises a radio module including a radio electromagnetic body such as a portion of an antenna. The radio communication apparatus further comprises a signal pathway operatively coupling the electronics system with the radio module and a conductive enclosure configured to provide electromagnetic isolation between the signal pathway and the radio electromagnetic body, the conductive enclosure further configured to at least partially impede electromagnetic coupling between the radio electromagnetic body and the host electromagnetic body via the conductive enclosure. For example, the conductive enclosure can act as a Faraday cage for the signal pathway, and include a wave trap which substantially prevents currents flowing through the conductive enclosure at one or more predetermined operating frequencies.

In some embodiments the radio module includes one or more further radio electromagnetic bodies. In some embodiments the radio module further comprises a radio electronics system operatively coupled to the radio electromagnetic body and optionally to the one or more further electromagnetic bodies.

In some embodiments, the signal pathway can be a transmission line coupling the electronics system to the one or more further radio electromagnetic bodies. In some embodiments, the signal pathway can be an electronics pathway coupling the electronics system to the radio electronics system, for example including power, data and ground lines.

In some embodiments, the radio module includes a radio electronics system and a radio electromagnetic body, the radio electronics system being operatively coupled to the radio electromagnetic body, for example to form a radio transceiver. The radio electronics system may further be contained wholly or partially within the radio electromagnetic body. In operation, the radio electromagnetic body has one or more electromagnetic characteristics, such as electric current, electric field and magnetic field, variable at one or more operating frequencies to facilitate radio communication. The radio communication apparatus also comprises a coupling element, operatively coupling the radio module and the host system. The coupling element includes an electronics pathway and conductive enclosure. The electronics pathway is configured to operatively couple the radio electronics system and the electronics system and/or host electronics system. The conductive enclosure can enclose at least a portion of the electronics pathway, thereby providing substantial electromagnetic isolation between the electronics pathway inside the conductive enclosure and electromagnetic radiation due to the radio electromagnetic body and the host electromagnetic body outside the conductive enclosure. In some embodiments, the conductive enclosure can be electromagnetically coupled to the host electromagnetic body.

In some embodiments of the invention, the radio communication apparatus or electronics system thereof comprises first and second electronics systems operatively coupled to first and second radio electromagnetic bodies, respectively. In operation the first and second radio electromagnetic bodies have, respectively, one or more first and one or more second electromagnetic characteristics variable at one or more first and second operating frequencies. The apparatus comprises a coupling element including a signal pathway and a conductive enclosure. The signal pathway is configured to operatively couple the second electronics system and the second radio electromagnetic body. The conductive enclosure is configured to provide electromagnetic isolation between the signal pathway and the one or more first electromagnetic characteristics. The conductive enclosure is further configured to impede electromagnetic coupling of at least one of the one or more first electromagnetic characteristics between the host electromagnetic body and at least one of the first radio electromagnetic body and the second electromagnetic body.

The inclusion of the conductive enclosure potentially introduces electromagnetic coupling between the host electromagnetic body and the radio electromagnetic body, since it may conduct current between electromagnetic bodies, for example. To ensure antenna operability, the conductive enclosure is configured to substantially isolate or at least impede the electromagnetic coupling of at least one of the one or more electromagnetic characteristics between the radio electromagnetic body and the host electromagnetic body. For example, the conductive enclosure can be configured to impede an RF pathway at one or more frequencies of radio operation by acting as a wave trap.

In some embodiments, an impedance matching and coupling means can further be provided, substantially separate from at least a portion of the conductive enclosure, to operatively couple the host electromagnetic body and the radio electromagnetic body at one or more frequencies of operation for desired antenna operation. For example, a differential connection between the radio electromagnetic body and the host electromagnetic body can be provided by the impedance matching and coupling means.

In some embodiments, radio communication apparatus provides a wireless communications system having an antenna element which is radiated against a ground plane or complementary antenna element that is not contained within the wireless communications system package. To accomplish this, the apparatus comprises a coupling element between the radio module and the electronics system and/or host system, which can communicatively couple the two systems, for example via a data port or transmission line, while retaining sufficient electromagnetic isolation between the radiating bodies of the wireless communications system and the external system for radio operation.

Radio Module

The present invention provides a radio module, for example within a wireless adapter, which includes a radio electromagnetic body forming part of an antenna and optionally an associated radio electronics system for operation thereof. The radio electromagnetic body and radio electronics system can be adapted to function together as a radio transmitter/receiver or "transceiver" for a host system to which the radio communication apparatus can be connected, for example using a pluggable USB or other standard or special-purpose connection or data port. Thus, the radio communication apparatus can provide for radio communications between the host system and a remote device.

In some embodiments, the radio electromagnetic body is a monopole antenna element contained within the apparatus, and configured for operation with a ground plane or counterpoise. The monopole antenna element can be of a shape adapted to fit within the radio wireless communication apparatus. For example, the antenna can be shaped as a box, cylinder, ellipsoid, helix, coil, loop, F-shape, T-shape, fractal or quasi-fractal or other antenna shape.

In some embodiments, the radio electromagnetic body is designed after the fashion of an Ultra Wide Band (UWB) antenna. For example, the radio electromagnetic body can be shaped as a spherical, parabolic, or elliptical radiating body having its long axis perpendicular to the host ground plane. Such designs can enable radio operation over a large bandwidth, for example over several octaves. In one embodiment, this design can enable radio operation such as WiMAX operation from relatively low frequencies, such as 800 MHz, up to frequency ranges above 5.8 GHz.

In some embodiments, additional radio electromagnetic body antenna elements can be provided within or attached to the radio module or apparatus housing. For example, a diversity antenna system employing at least one of modal, spatial, pattern, or polarization diversity can be provided in this manner. The diversity antenna can be provided as a notch, slot or cavity within the radio electromagnetic body.

In some embodiments, at least a portion of a radio electromagnetic body can be mounted on the apparatus housing, for example as a movable antenna portion. In operation, a user may be able to orient, expand or collapse a movable antenna portion of this type to adjust radio performance, for example expressible as adjustments to gain, signal-to-noise ratio, antenna directivity, frequency, bandwidth, and the like.

In some embodiments, the radio module can include additional radio electromagnetic bodies or antenna elements, such as can be directed toward a diversity antenna system. Diversity antennas, or multiple independent radiating antenna elements, can be employed within a radio communications system to increase communication reliability. For example, by communicating simultaneously over multiple wireless paths or by selecting the current best available path, the signal-to-noise ratio of a channel can be substantially improved in order to sustain higher data rates. Such a strategy can be important, for example when deep signal fading situations are liable to occur, for example at one antenna.

Antenna diversity can be achieved in several ways, such as through pattern diversity, polarization diversity, spatial diversity, and modal diversity, as would be understood by a worker skilled in the art. A diversity scheme typically uses multiple antennas or multiple operating modes of a single antenna to associate different electromagnetic fields with the one or more antennas. These different fields provide for different communication paths, which increases the likelihood of a reliable path being available at a given time. The most reliable path can then be selected, or paths can be combined, to provide for substantially continuous, high-quality communication channel access. Antenna diversity can be applied to radio transmission, radio reception, or a combination thereof. Additional antenna elements may also be used to separate transmit and receive functions, provide multi-mode or multi-band functionality, or provide other capabilities as would be readily understood by a worker skilled in the art.

In some embodiments, the radio module can contain additional antenna elements or radiating bodies to provide a diversity antenna system, wherein at least one antenna can be operated within a lower bandwidth than another antenna. For example, if antenna diversity is used only for radio reception, the additional antenna elements of the diversity system may only be required to operate in a narrower radio band designated for radio reception.

In some embodiments, the bandwidth requirements of the additional antenna elements are substantially the same as a first antenna. Such can be the case for WiMAX and similar applications. In this case, multiple antennas having similar dimensions may be contained within a typically compact wireless communication apparatus housing. This can be achieved in many circumstances by using substantially small antenna elements or radiating bodies, since many applications such as WiMAX can typically operate at higher frequencies (for example about 2.3 GHz and up) and consequently can be accommodated by sufficiently short antenna lengths.

In including a diversity antenna, or additional antenna elements or radiating bodies, within the radio module, requirements for substantial isolation between antenna elements must often be taken into account. For example, at least about 10 dB of isolation can be required between the main and the secondary antennas for some typical applications. While such isolation can be achieved by using one or more lower-efficiency antenna elements, a superior diversity system typically strives to achieve isolation through electromagnetic isolation means such as polarization, modal, pattern or spatial diversity, or a combination thereof. Due to the potentially short nature of the antenna body in terms of length and width in typical applications, polarization and modal diversity can be effective choices to maximize electromagnetic isolation between antenna elements at radio frequencies.

In some embodiments, a short apparatus length is desirable, and the mounting of an additional radio electromagnetic body on the apparatus can be detrimental to the overall design requirements, including length, thickness, width and cost. Therefore, additional antenna elements or radiating bodies are supplied within the radio module in addition to the radio electromagnetic body to facilitate a diversity system.

One approach for compactly integrating additional antenna elements into the radio module is to include either notch, slot, patch or strip style antennas within the radio electromagnetic body. Some of these antenna types, instead of being positively defined by a conducting body, are defined by a slot or notch in an outer metallic body; conceptually the roles of the conducting body and the surrounding medium are reversed. A benefit of using this type of antenna as an additional antenna is that the slot or notch can be incorporated within the first radio electromagnetic body initially described above. This approach can conserve space and simplify construction of a diversity antenna system.

The radio electronics system potentially included in the radio module is adapted for use with the radio electromagnetic body for radio transmission, radio reception, or a combination thereof. For example, the electronics can include circuitry for radio signal modulation and demodulation, signal amplification, filtering, frequency conversion, driving the radio electromagnetic body at radio frequencies for transmission, sampling and encoding the signals for reception, and digital communication with a host system coupled to the radio module, via the coupling element as described below. In one embodiment, for example when a radio electronics system is not provided, the electronics system is adapted to facilitate radio transmission and/or reception, for example including circuitry as described above.

In some embodiments, the wireless communication apparatus is adapted to function as a USB (Universal Serial Bus)

compliant device for communicating with a host system. For example, the radio electronics and radio electromagnetic body can be powered using a standard +5V and ground supply, and can communicate over a serial data link comprising two differential communication lines. Alternatively, the apparatus can be adapted to function using another protocol such as IEEE 1394, Ethernet, PCI, PCMCIA, ExpressCard interface or the like.

In some embodiments, at least a portion of the radio electronics system of the radio module is surrounded by at least a portion of the radio electromagnetic body. For example, the radio electromagnetic body can be a metallic structure such as the casing of the wireless communication apparatus, having a cavity containing the radio electronics system as described above. Containing the radio electronics system within the radio electromagnetic body in this manner can permit the radio electromagnetic body to be appropriately sized and situated with respect to the host electromagnetic body or ground plane without being constrained by placement considerations of the electronics.

Due to an electromagnetic phenomenon commonly referred to as the "skin effect", electrical currents varying at radio frequencies, such as can occur in operation of a radiating body, are substantially restricted to the outer portion of the radio electromagnetic body. Therefore, inclusion of a cavity in the radio electromagnetic body can be accomplished in practice without substantially affecting antenna performance. In the same way the "skin effect" keeps radio frequency (RF) currents inside the cavity contained and therefore isolated from the outside RF currents and fields.

In some embodiments, due to the proximity of the radio electronics system and radio electromagnetic body in the radio module, care must be taken to ensure that noise associated with the radio electronics system does not substantially couple onto the radio electromagnetic body, and vice versa. In some embodiments, the radio electronics system can be shielded from the radio electromagnetic body using isolating means such as conventional shield cans, Faraday cages, or other electromagnetic enclosures for this purpose.

In some embodiments, the apparatus has a total length of less than or equal to about 60 mm. This can ensure a conveniently sized package suitable to user requirements.

In some embodiments, the apparatus is adapted for radio operation in multiple frequency bands. For example, the apparatus can operate as a wireless transceiver in multiple bands with center frequencies between about 800 kHz and about 6 GHz.

Host System

The radio communication apparatus can be adapted to provide radio communications functionality to a host system, for example a portion of a computer, cellular telephone, computer peripheral, personal digital assistant device or the like. The host system includes a host electronics system and a host electromagnetic body, which can operate as a complementary radiating body, ground element, or counterpoise to the radio electromagnetic body of the radio module. An electronics system of the radio communication apparatus may be integrally provided within the host system.

In some embodiments, the host electromagnetic body acts as a substantial ground plane or counterpoise against which the radio electromagnetic body and/or other electromagnetic bodies can radiate electromagnetically. For example, an idealized monopole antenna comprises a radiating body and a flat ground plane, which reflects electromagnetic energy such that the system behaves as if a second radiating body were present, thereby imitating a dipole antenna system. The virtual second radiating body can be thought of as a reflection of the true radiating body seen in the ground plane "mirror". A conductive surface of sufficient size and shape, such as the host electromagnetic body, can function substantially as a practical ground plane for the radio electromagnetic body, the two bodies thereby comprising a monopole antenna. This functionality may exist even if the host electromagnetic body is not connected to earth ground.

In some embodiments, the host system is associated with a personal computer system, such as a laptop computer. The host electronics system can therefore be directed toward functions such as supporting a user interface and relaying data between said user interface and an interface for connection to the radio communication apparatus.

In some embodiments, the host electromagnetic body is a conductive shielding surrounding internal components of the host system.

In some embodiments, the host system, for example a personal computer system, includes a ground plane which operates as the host electromagnetic body. The ground plane can further serve as a ground for a power supply system of the host system, host electronics system, and/or other electronics systems. For example, the ground plane can be connected to the USB shielding of a USB connector.

Figure 5:
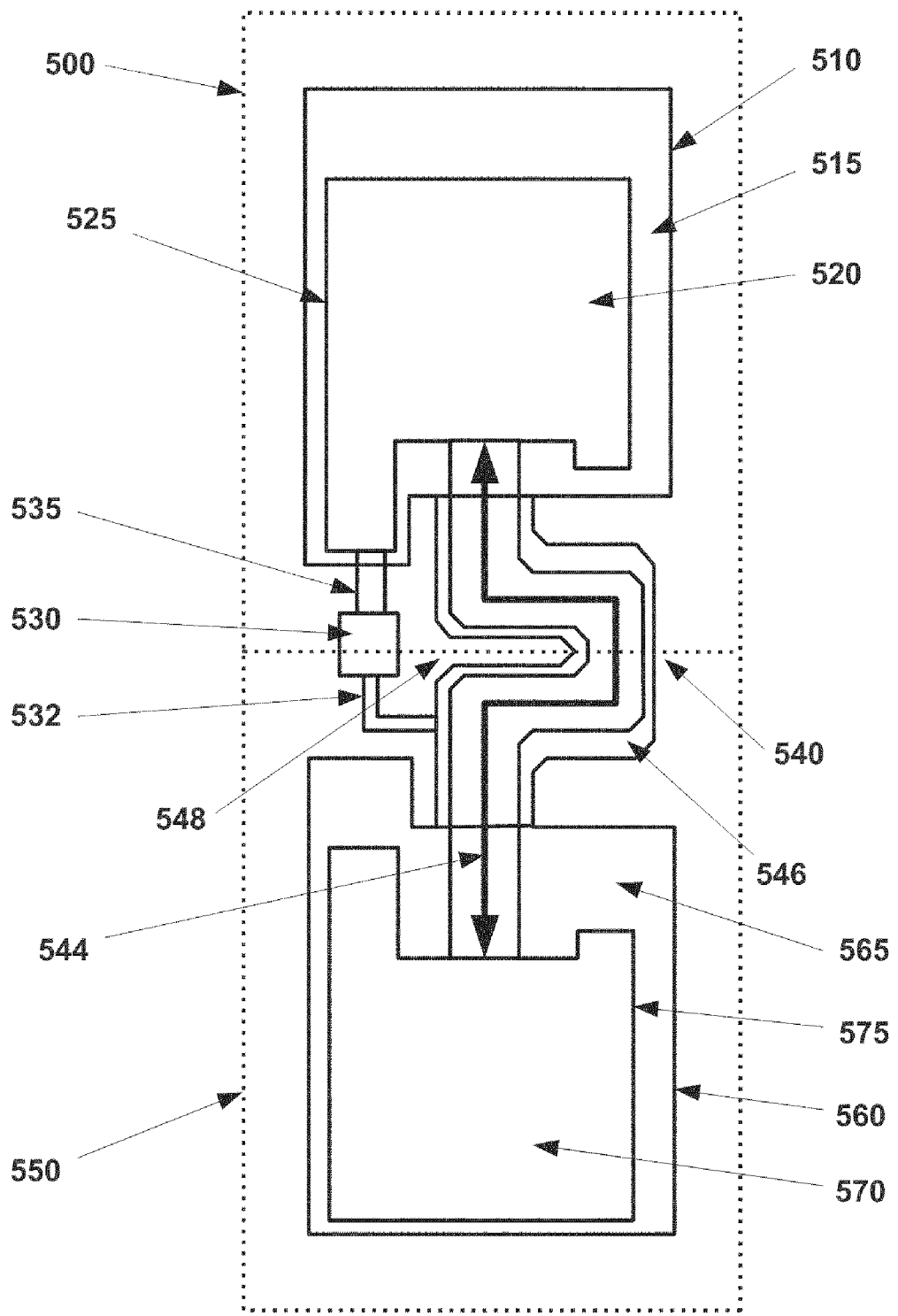
FIG. 5 illustrates a radio communication apparatus coupled to a host system in accordance with one embodiment of the invention.

In some embodiments, for example as depicted in FIG. 5, the host system comprises a second body similar to the radio communication apparatus. For example, the host system can be a portion of a handheld device such as a cellular telephone having two bodies connected by a coupling element, or a series of coupling elements. Such a device can operate as an inclusive dipole antenna, having two radiating bodies each of which contain electronics for the operation thereof. The electronics in each body can communicate but due to the operation of the coupling element can retain the electromagnetic separation required for two radiating bodies to operate as a dipole antenna. These two separate bodies can contain distinct radios such as a cellular transceiver in one and WiMAX electronics in the other and or Bluetooth and or batteries etc. While FIG. 5 shows a common feed system for the radio, separate RF feeds can also be used to provide for distinct frequency bands or antenna modes.

Coupling Element

The radio communication apparatus further comprises a coupling element, which can operatively couple the radio module and the electronics system, for example electromagnetically and/or electronically. The coupling element may comprise components such as a signal pathway, conductive enclosure, impedance matching components, transmission lines, and the like. The coupling element is described herein as a separate entity, but can be integrated with the radio communication apparatus or the host system for convenience, for example the coupling element and the radio module can be contained within a single housing.

In some embodiments, the coupling element or signal pathway thereof comprises an electronics pathway, including for example a plurality of conductors such as wires and/or circuit traces, configured to facilitate communication between the electronics system and a radio electronics system of the radio module. In addition to signal lines for data transfer, handshaking, and other functions, the conductors can be used for other electrical coupling, such as providing power and ground links between the host system and the radio/antenna electronics. In one embodiment, signal lines may include optical isolation or other components.

The coupling element further comprises a conductive enclosure, at least a portion of the signal pathway being contained within the conductive enclosure. The conductive enclosure can act as an electromagnetic insulator or Faraday cage for the signal pathway, acting to inhibit electromagnetic coupling, for example capacitive or inductive coupling, between the radio electromagnetic body and the conductors of the signal pathway. This can reduce undesired noise introduced from one system to the other, and additionally can help to ensure that the signal pathway does not function as an unimpeded path between portions of the radio module, such as the radio electromagnetic body and other components, for example, the electronics system, which could adversely affect antenna operation. Additionally, the conductive enclosure can improve integrity of data signals using the electronics pathway. For example the conductive enclosure can operate similarly to a ground plane of a microstrip or stripline transmission line.

In some embodiments, the conductive enclosure operates as a Faraday cage. That is, the conductive enclosure acts as a hollow conducting body wherein electrons rearrange themselves within the conducting body or surface thereof in response to an applied electromagnetic field. The rearrangement of electrons distributes electrical charge around the conducting body such that the electromagnetic field is substantially cancelled inside the conducting body. In this manner, electromagnetic coupling between the radio electromagnetic body and the signal pathway is substantially reduced or eliminated.

The conductive enclosure itself can be prone to electromagnetic coupling with the radio electromagnetic body, since the antenna's electromagnetic field can be substantial near the conductive enclosure. For example, in one embodiment of the present invention, the conductive enclosure can be directly electrically connected to the radio electromagnetic body, for example via a low-impedance resistive connection; in another embodiment the conductive enclosure can be proximate to the radio electromagnetic body so as to cause an inductive or capacitive coupling. Therefore, electric currents may arise in the conductive enclosure sympathetic with antenna operation, and varying substantially at the frequencies of operation of the antenna. Due to the "skin effect" phenomenon, these electric currents are substantially confined to the outer surface of the conductive enclosure, leaving the inner surface substantially free of current flow. The conductive enclosure can therefore act as an electromagnetic isolator or Faraday cage even when current flows on the outer surface. In one embodiment, the interior of the conductive enclosure can therefore also function as a ground link between the electronics system and the radio electronics system.

Current flow on the outer surface of the conductive enclosure could, if unimpeded, cause excessive or unwanted electromagnetic coupling of the radio electromagnetic body and the host electromagnetic body via the conductive enclosure. Such electromagnetic coupling could potentially negatively impact antenna operation if not addressed, since the radio electromagnetic body and the host electromagnetic body typically require a sufficiently high-impedance separation for efficient operation. To ensure a sufficient impedance separation at the frequencies of antenna operation, the conductive enclosure is adapted to comprise a wave trap operating in the appropriate frequency ranges. For example, the conductive enclosure can comprise a "U" shaped, "S"-shaped, direct or substantially straight, or helically shaped portion operating as a radio frequency wave trap. In operation of this wave trap, current flowing through the outer layer of the conductive enclosure at predetermined frequencies can encounter high impedance due to the structure or shape of the wave trap, substantially preventing such current from flowing down the entire conductive enclosure to the host electromagnetic body, thereby isolating the radio electromagnetic body and the host electromagnetic body. For example, the "U"-shaped wave trap can induce a field which can tend to substantially cancel currents varying at predetermined frequencies, wherein the predetermined frequencies are substantially inversely proportional to the length of the "U" shape.

In some embodiments, the inclusion of the wave trap facilitates differential excitation of the host electromagnetic body and the radio electromagnetic body. For example, since the wave trap can substantially impede electromagnetic coupling for a desired range of frequencies, a path can be introduced in parallel to the wave trap which can be configured to establish a desired level of electromagnetic coupling in the desired range of frequencies, as required for antenna operation.

In some embodiments, the coupling element can comprise a transmission path parallel to at least a portion of the signal pathway, for example between the radio electronics system and the host electromagnetic body. The parallel transmission path can be established using a transmission line originating from the radio electronics system, which may be inside the radio electromagnetic body, the transmission line coupled across to the host electromagnetic body. For example, the transmission line can be coupled to the host electromagnetic body through one or more elements such as resistive, capacitive, inductive or like elements, which may bridge over the wave trap and use a remaining portion of the conductive enclosure as a coupling, the portion excluding the wave trap. The resistive, capacitive, inductive or like elements can provide a predetermined impedance for an appropriate coupling or impedance match.

In some embodiments, the coupling element is packaged with the radio module to form a single convenient package having a connector or plug for connection to the host system. In some embodiments, the coupling element comprises a universal serial bus (USB) connector, which is configured to mate with a USB connection receptacle mounted on the host system and coupled to the electronics system. Such a package can resemble a typical USB network adapter or memory stick. The USB connector typically has four internal conductors for power, ground, and two-way differential serial data communication. The four conductors are housed inside a conducting USB shield which is typically connected to the host ground or host electromagnetic body. In some embodiments, therefore, the USB shield is electrically coupled to the host electromagnetic body and forms part of a conductive enclosure shielding an electronics pathway.

In some embodiments, a portion of the coupling element is provided on a printed circuit board. For example, the conductive enclosure can be printed as a wide conductive trace on one or more layers of the printed circuit board, surrounding one or more second layers containing narrower conductive traces of the electronics pathway. The conductive enclosure can further be electrically connected to a USB shield through a USB connector. Separate outer most layers of the conductive enclosure can further be connected using vias or other inter-layer electrical connection means, thereby creating a substantial enclosure on four sides of the electronics pathway.

In some embodiments, additional impedance matching can be provided between the radio electromagnetic body and a transmission line operatively coupling the radio electromagnetic body to the radio electronics system. Such impedance matching is common in radio design to ensure efficient transfer of electromagnetic energy between the radio electromagnetic body, the transmission line, and the radio electronics system. For example, impedance matching circuitry can involve inductive and capacitive elements connected in a combination of series and parallel connections between the radio electromagnetic body, the transmission line, and the host electromagnetic body. For this purpose, inductive and capacitive elements can be provided as discrete components or distributed structures included in the coupling element between the radio electromagnetic body, the transmission line, and the host electromagnetic body, as would be understood by a worker skilled in the art.

The invention will now be described with reference to specific examples. It will be understood that the following examples are intended to describe embodiments of the invention and are not intended to limit the invention in any way.

EXAMPLES

Example 1

Figure 2:
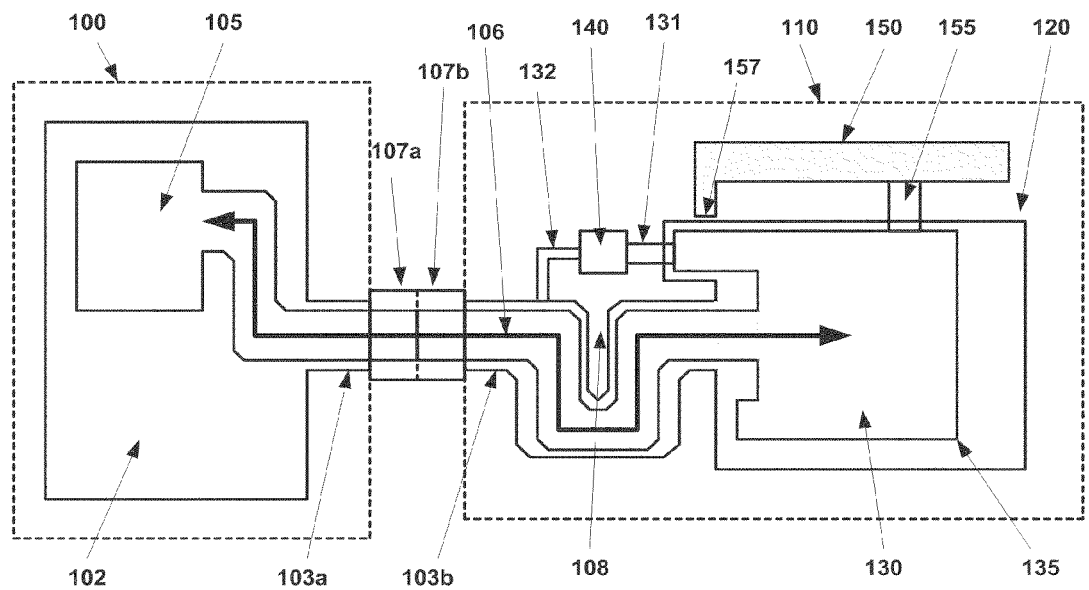
FIG. 2 illustrates a radio communication apparatus coupled to a host system in accordance with another embodiment of the invention that includes a diversity antenna system.

FIGS. 1 and 2 illustrate a radio communication apparatus package 110 coupled to a host system 100 according to one embodiment of the present invention. The host system 100 can be, for example, a personal computer or portion thereof, having an integral electronics system 105 and a host electromagnetic body or ground plane 102. The host system also includes a USB or similar connection port having a mating section 107a which connects to a corresponding mating section 107b of the apparatus package 110. These two mating sections can connect the host system 100 and the apparatus package 110 during operation. A conductive enclosure or shielding 103a is electrically connected to the ground plane 102 and extends from the host system 100 to the apparatus package 110 by virtue of electrical connection through external shielding of the two mating sections 107a and 107b and the shield 103b. The conductive enclosure 103a and 103b surrounds at least a portion of an electronics pathway 106 which couples at a first end to the electronics system 105, and which couples at a second end to a radio electronics system 130. The conductive enclosure 103a and 103b and the external shielding of the two mating sections 107a and 107b define a substantially continuous Faraday cage surrounding the electronics pathway 106. In the case of a USB connection, the electronics pathway 106 includes four electrical conductors, conveying power, ground, and two differential serial data lines.

The apparatus package 110 is a packaged body containing the radio module, comprising a radio electromagnetic body 120 and a radio electronics system 130 operatively coupled thereto. The coupling includes a transmission line 131, a matching section 140 and a conductor 132 providing a path across the isolator 108 to the host external RF ground plane 102 via a portion of the conductive enclosure 103a and 103b, and the external shielding of the two mating sections 107a and 107b. The transmission line 131 can be a single conductor, or a transmission line such as a coaxial, microstrip, stripline transmission line or the like. The radio electronics system 130 is further operatively coupled internally to the electronics pathway 106, which continues from the electronics system 105 through the connection port to the radio electronics system 130. In one mode of operation, the radio electronics system 130 is adapted to receive digital information from the electronics pathway 106 according to a protocol, for example a USB-compliant protocol and transmit said digital information by radio communication, including encoding, modulation, and driving of the radio electromagnetic body 120 according to protocols as would be understood by a worker skilled in the art. In another mode of operation, the radio electronics system 130 is adapted to receive digital information by radio communication, including being driven by the radio electromagnetic body 120, demodulation, and decoding according to protocols as would be understood by a worker skilled in the art, and transmit said digital information over the electronics pathway according to a protocol, for example a USB-compliant protocol.

Except for the transmission line 131 the RF match 140 and the conductor 132, the radio electronics system 130 is electromagnetically shielded from the radio electromagnetic body 120 by shielding means 135 to reduce undesired noise coupling therebetween. The shielding means 135 is shown diagrammatically as a single enclosing conductor body, but can comprise one or more conducting bodies such as shield cans placed over electronic components in practice. To suppress noise and inhibit undesired electromagnetic coupling between the radio electromagnetic body 120 and the ground plane 102 via the electronics pathway 106, the portion of the electronics pathway 106 within the apparatus package 110 is contained within a conductive enclosure or shielding 103b, which is coupled to the shielding 103a at mating sections 107a and 107b of the connection port to form a continuous conductive enclosure for the electronics pathway 106. The shielding 103b can be printed as conductive surfaces on two layers of a printed circuit board, connected by vias, with an intermediate layer having conductive traces comprising the electronics pathway 106 enclosed by the conductive surfaces and the connecting vias. As illustrated, the shielding 103b is configured to form a "U"-shaped wave trap 108 which is configured, for example by size and shape, to act as a relatively high impedance element to electrical signals varying at frequencies near operating frequencies of the radio electromagnetic body 120. This inhibits undesired electromagnetic coupling via the conductive enclosure at these frequencies. In this manner, a voltage can be generated between the radio electromagnetic body 120 and the ground plane 102. Characteristics of this generated voltage can further be modified via the impedance path 131, 140 and 132 bridging the wave trap 108. This generated voltage can be coupled to the RF radio electronics inside the enclosure 120.

The radio electromagnetic body 120 is depicted as a conducting body surrounding the radio electronics system 130, and separated therefrom by the shielding means 135. The radio electromagnetic body 120 can therefore define a cavity within which the radio electronics system 130 is contained. The shielding means 135, the interior of the radio electromagnetic body 120, and the conductive enclosure 103a and 103b, along with the external shielding of the mating connectors 107a and 107b operate together as a Faraday cage which can operate to substantially electromagnetically isolate the radio electromagnetic body 120 from the radio electronics system 130 and the electronics pathway 106.

For purposes of impedance matching between the radio electromagnetic body 120 and the transmission line 131, an electromagnetic coupling between the radio electromagnetic body 120 and the ground plane 102, having a predetermined impedance, may be required. For example, selected inductance or capacitance may be required in series or parallel or a combination thereof between some or all of the transmission line 131, radio electromagnetic body 120, and ground plane 102. An antenna matching element 140 is provided for this purpose, providing an electrical or electromagnetic coupling between the transmission line 131, the radio electromagnetic body 120, and the ground plane 102 which is configured to provide an efficient coupling between the radio electromagnetic body 120 and the transmission line 131 as would be understood by a worker skilled in the art. The antenna matching element 140 is operatively coupled to the ground plane 102 via an electrical connection including conductor 132 coupling the antenna matching element 140 to the conductive enclosure 103b on the side of the wave trap 108 opposite the radio electronics system 130. The combination of transmission line 131, matching element 140, and conductor 132 therefore establishes a bridge across the wave trap 108 having a prespecified impedance. Optionally, this bridge can also supply a ground reference for the radio electronics system 130, the ground reference being coupled to the ground plane 102.

FIG. 2 illustrates an apparatus package 110 coupled to a host system 100 according to one embodiment of the present invention, wherein the radio module has an additional radio electromagnetic body 150. All other components are as described above with respect to FIG. 1, however, the additional radio electromagnetic body 150 is operatively coupled to the radio electronics system 130 by a transmission line 155 and associated RF matching circuitry as required, for example a wire or conductive circuit board trace or other conducting component, or a stripline, microstrip or coaxial element. The additional radio electromagnetic body 150 can optionally be electromagnetically coupled to the radio electromagnetic body 120 at a terminal 157 of the additional radio electromagnetic body 150. For example, a direct electrical connection can be made at the terminal 157 between the radio electromagnetic body 120 and the additional radio electromagnetic body 150. A combination of the coupling at the terminal 157, and the shaping and relative orientation of the radio electromagnetic body 120 and the additional radio electromagnetic body 150 can be selected to provide antenna diversity, such as modal, spatial, pattern, polarization diversity or the like. The transmission line 155 can further include an impedance matching circuit, configured for efficient antenna operation as would be understood by a worker skilled in the art.

In embodiments of the present invention, the additional radio electromagnetic body 150 or like bodies can be provided for purposes such as antenna diversity, multi-input multi-output (MIMO) operation, operation on multiple frequency bands, separation of transmit and receive functions, providing a multi-mode device, or other purposes as would be readily understood by a worker skilled in the art.

The additional radio electromagnetic body 150 can be defined by an additional conducting body or other structure, such as a notch or slot defined within the conducting body of the radio electromagnetic body 120. FIGS. 7A to 7H illustrate several examples of notch or slot antennas which can be realizations of the additional radio electromagnetic body 150, including a description of a connection between the radio electromagnetic body 120 and the additional radio electromagnetic body 150 at terminal 157.

Figure 3:
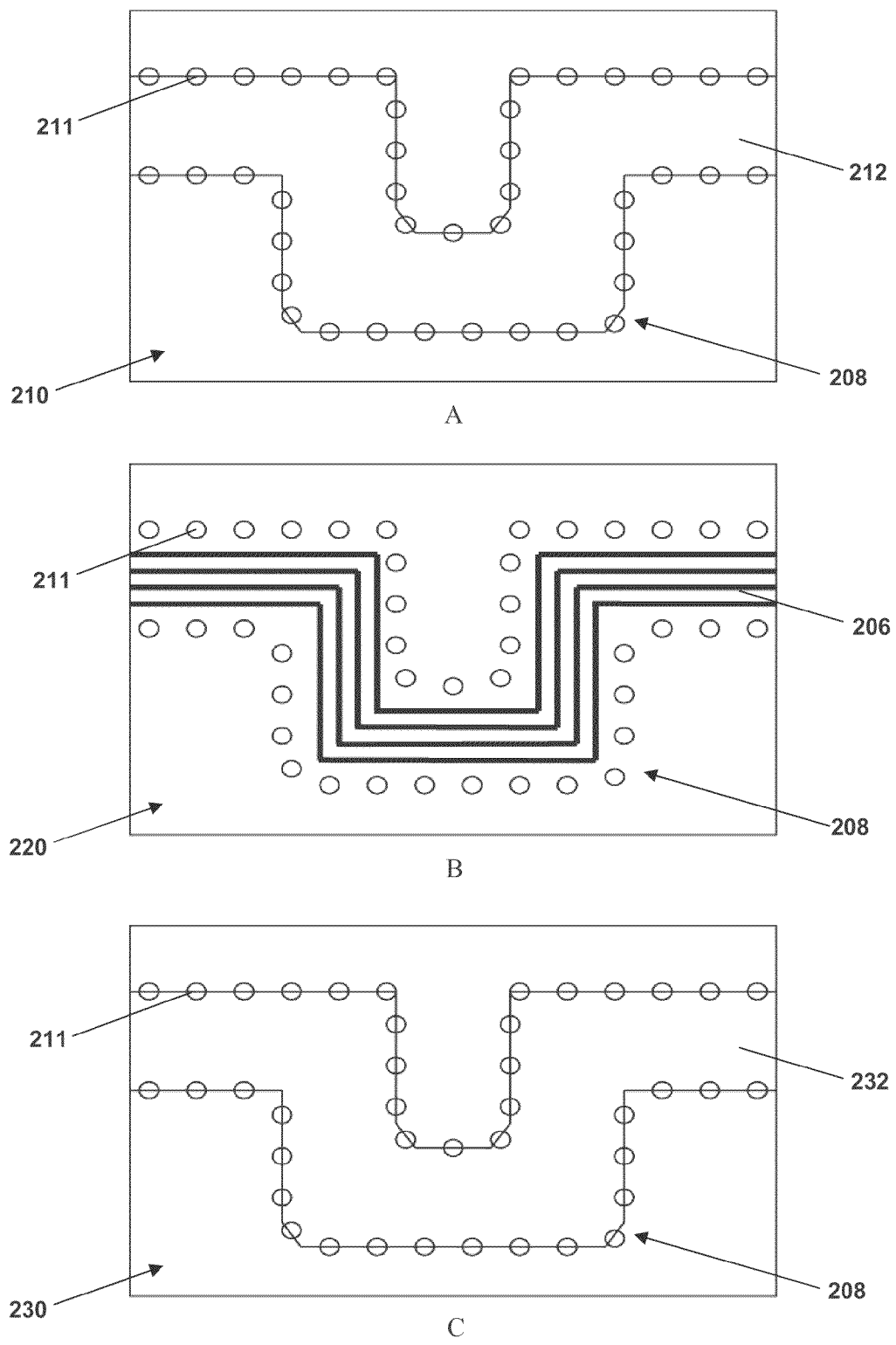
FIGS. 3A to 3C illustrate a signal, an electronics pathway and a conductive enclosure, respectively, etched onto plural printed circuit board layers in accordance with one embodiment of the invention.

FIGS. 3A to 3C illustrate an exploded view of three layers of a portion of a printed circuit board forming part of a coupling element having a "U"-shaped wave trap. The printed circuit board includes an upper layer 210, a middle layer 220, and a lower layer 230. The upper layer 210 and lower layer 230 have conductive surfaces 212 and 232 etched thereupon, the conductive surfaces 212 and 232 connected by a plurality of vias, such as the via 211 shown, or other electrically conductive elements passing between the upper layer 210 the lower layer 230. The conductive surfaces 212 and 232 and the plurality of vias form a conductive enclosure or Faraday cage around a communication channel 206 comprising multiple electrical traces for signal, power, and ground connections between electronics on board the coupling element and electronics on board the host system. The conductive surfaces 212 and 232, along with the communication channel 206 are arranged on the printed circuit board to have a "U"-shaped bend 208 therein. The "U"-shaped bend acts as a wave trap exhibiting a sufficiently high impedance to electrical currents at frequencies near those of operation of an antenna contained within the radio module. Other shapes, for example as illustrated in FIGS. 6B-6F, are also possible.

Example 2

Figure 4:
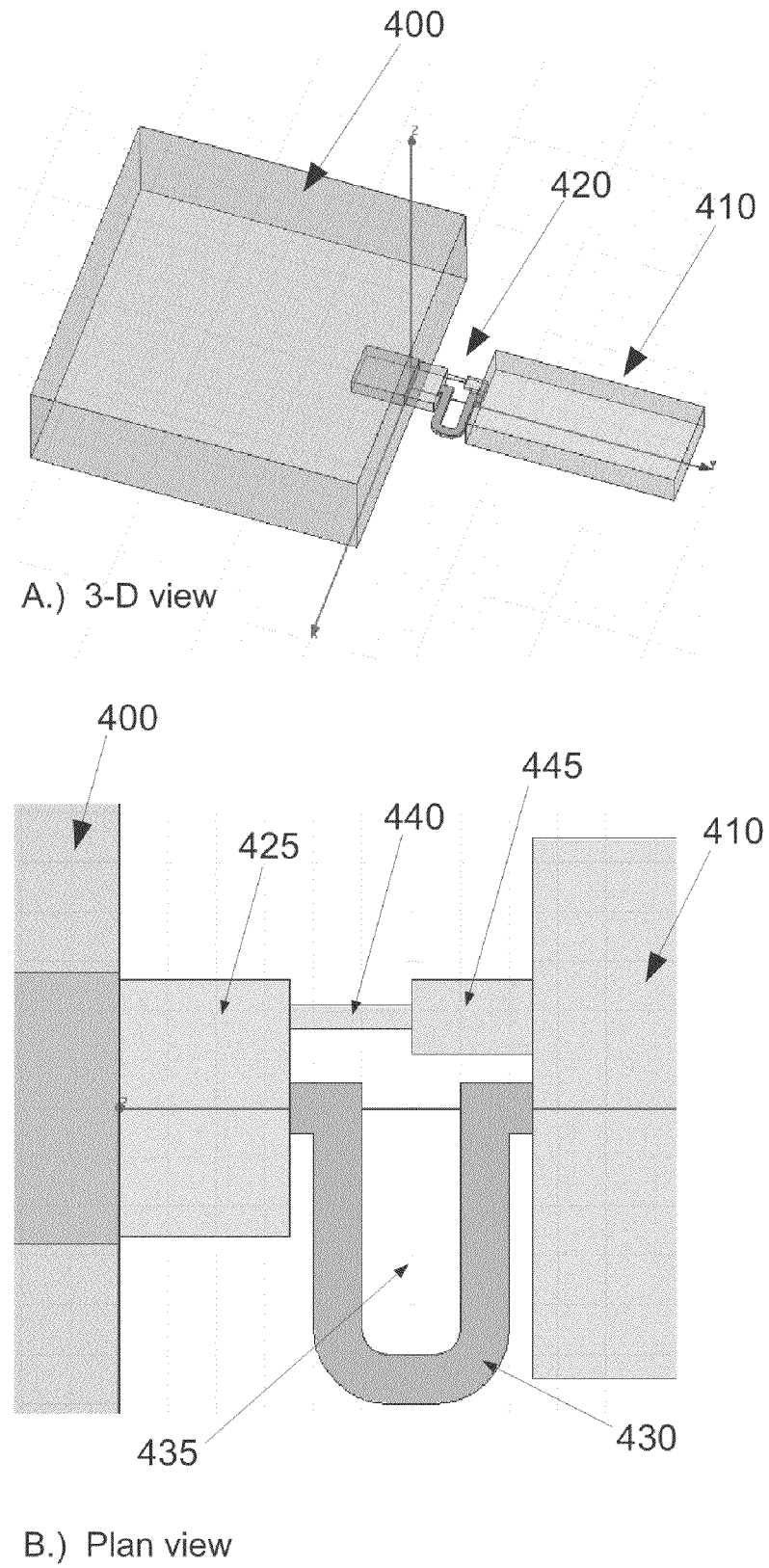
FIGS. 4A and 4B illustrate a perspective view and a plan view, respectively, of a radio communication apparatus in accordance with another embodiment of the invention.

FIGS. 4A and 4B illustrate the layout of the coupling element 420 coupling a host system 400 and an antenna body 410 according to one embodiment of the present invention. In the present embodiment, the coupling element 420 includes a mating USB connection having a shielded outer portion 425 connected to a ground plane of the host system 400. A conductive enclosure 430 is coupled to the shielded outer portion 425 such that a signal pathway comprising USB differential data, power and ground lines can be routed from the host system to the antenna body through the shielded outer portion 425 and the conductive enclosure 430. The conductive enclosure 430 includes a wave trap, such as the "U"-shaped wave trap 435, or one of the alternative wave traps illustrated in FIG. 6, which is configured to substantially impede the flow of radio frequency energy or current between the host system 400 and the antenna body 410.

For electromagnetic coupling of the antenna body 410 and the host system 400, as may be required for effective operation of an antenna comprising a radio electromagnetic body on the antenna body 410 and a host electromagnetic body or ground plane of the host system 400, the coupling element 420 includes an antenna connection 440 between the shielded outer portion 425 of the USB connection and an antenna matching circuit 445 coupled to a radio electromagnetic body on the antenna body 410 and the radio electronics system contained therein. The antenna connection 440 can comprise a conductive material or a transmission line, such as a microstrip or stripline, for example. The antenna matching circuit 445 can be configured to have an electrical impedance that facilitates efficient transmission of electromagnetic energy between the radio electromagnetic body internal RF radio and the antenna connection 440. For example, the antenna matching circuit 445 can include inductive and capacitive elements in series or parallel, or a combination thereof. These elements can be constructed using discrete electrical components or electromagnetic structures such as distributed matching components, for example as defined by conductive traces on a printed circuit board. The impedance between the elements of the host system 400 and the antenna body 410 and subsequent RF radio is therefore configured by the combination of the wave trap 435 and the antenna matching system 445. Antenna matching or impedance matching is typically used to improve power transfer and reduce signal reflections between electromagnetically coupled elements, as would be understood by a worker skilled in the art.

Example 3

FIG. 5 illustrates two radio bodies 500 and 550 coupled together to form a two-element or "dipole" antenna according to one embodiment of the present invention. The dipole antenna is characterized in that each of two radiating bodies 510 and 560 are driven by a local inclusive electronics system 520 and 570, respectively, the electronics systems communicating through a signal pathway 544 of a coupling element 546, the coupling element 546 configured to substantially impede electromagnetic coupling of the radiating bodies directly through the coupling element 546 by incorporation of a wave trap 548 with the coupling element 546.

Coupling between the radiating bodies and/or the electronics systems can be provided using a matching element 530 configured to substantially provide a desired electromagnetic coupling, for example as is required to operate the two radiating bodies 510 and 560 as a dipole antenna, and to match the impedance of the radiating bodies with transmission lines operatively coupling the radiating bodies 510 and 560 to the RF portion of the electronics system 520.

FIG. 5 illustrates a first antenna element 500 comprising a first radio electromagnetic body 510 operatively coupled to a first electronics system 520 via a transmission line 535. The transmission line 535 can be a single conductor, or a transmission line such as a coaxial element, stripline, microstrip or the like. In the present embodiment, the first electronics system 520 is contained within a cavity 515 defined by the first radio electromagnetic body 510, the first electronics system 520 being substantially shielded by an electromagnetic shielding 525, for example comprising a plurality of shield cans or Faraday cage enclosing components of the first electronics system 520. The two radiating bodies 510 and 560 and the transmission line 535 are further operatively coupled to an antenna matching circuit 530 which can match the impedance between the first radio electromagnetic body 510 and the second radio electromagnetic body 560 for efficient antenna operation. The antenna matching circuit 530 is further coupled, via conductor 532, to the coupling element 546 on the far side of the electronics system 520 from the wave trap 548 and thereby to the second radio electromagnetic body 560.

FIG. 5 further illustrates a second antenna element 550 comprising a second radio electromagnetic body 560 operatively coupled to a second electronics system 570. In the present embodiment, the second electronics system 570 is contained within a cavity 565 defined by the second radio electromagnetic body 560, the second electronics system 570 being substantially shielded by an electromagnetic shielding 575, for example comprising a plurality of shield cans or Faraday cage enclosing components of the second electronics system 570. The second radio electromagnetic body 560 is further operatively coupled to the antenna matching circuit 530 via coupling element 546 and conductor 532.

FIG. 5 also illustrates a coupling element 540 operatively coupling the first antenna element 500 and the second antenna element 550. The coupling element comprises an electronics pathway 544 which operatively couples the first electronics system 520 and the second electronics system 570. The electronics pathway 544 is enclosed within a conductive enclosure 546 which substantially prevents undesired electromagnetic coupling between the electronics pathway 544 and the first and second radiating bodies 510 and 560. The conductive enclosure 546 is further configured to comprise a wave trap 548, such as a "U"-shaped wave trap. The wave trap 548 is configured to enable or provide for sufficiently large inductance so that a voltage drop can be generated or detected across the trap 548 via the match 530 to the RF radio within its own enclosure.

In FIG. 5, the conductive enclosure 546, the shieldings 525 and 575, and the interiors of the radiating bodies 510 and 560 may form a substantially continuous Faraday cage enclosing the first electronics system 520, the second electronics system 570, and the electronics pathway 544. The Faraday cage substantially electromagnetically isolates the electronics systems and connecting lines of the electronics pathway 544 from the external radiating bodies 510 and 560.

Example 4

FIGS. 6A to 6F illustrate several alternative embodiments for the shape and orientation of the conductive enclosure or RF isolator 608a-608f between the host system 600 and the antenna body 610. In each case, the conductive enclosure is configured to operate as a wave trap at predetermined radio frequencies corresponding to frequencies of operation of the antenna associated with the radio electromagnetic body. The embodiments 608a, 608b, and 608f, the "Flat U," "Flat S" and "Direct" traps, respectively, can be oriented within the plane of a printed circuit board (PCB) associated with the radio electronics, and therefore have the advantage of being realizable on the same PCB. The remaining embodiments 608c-608e, the "Edge U", "Edge S" and "Helix Trap", respectively, can be realized using other construction methods, such as employing flexible PCB material, hard line or external components, metal in plastic and injection moulding techniques, as would be understood by a worker skilled in the art.

In some embodiments, the conductive enclosures 608a-608f can operate as wave traps or isolators, for example according to the principle of a meander line, as would be understood by a worker skilled in the art. While the embodiments of 608b and 608d can have shorter lengths than the other embodiments, they can still exhibit sufficient inductance to operate as a wave trap for the purposes of the present invention. For example, the embodiments of 608b and 608d can operate as a wave trap for a higher range of operating frequencies of the radio communication apparatus. An advantage of the "S" shaped conductive enclosures 608b and 608d is that they can enable the coupling element, and therefore of the entire radio communication apparatus, to be substantially compact.

Since the structures depicted in FIG. 6 can be short with respect to a quarter of a wavelength of the highest RF operating frequency, the outside surface of the RF isolator can act substantially as a series inductor between the host ground plane and the radio electromagnetic body. In this situation a transmission line can be connected between the host system and the radio module, for example coupling the radio electronics system and the host electromagnetic body at a predetermined impedance.

In some embodiments, the wave traps or isolators defined by the shaped conductive enclosures, such as illustrated in FIGS. 6A to 6F as 608a-608f, can operate by providing an electrical pathway having an inductance which can result in a sufficiently high electrical impedance at frequencies of operation of the antenna. The inductance can be provided by the interaction of portions of the wave traps or isolators, associated for example with an electromagnetic field being generated in the conductive portions and gaps defined by the wave traps or isolators, as would be readily understood by a worker skilled in the art.

Figure 6A:
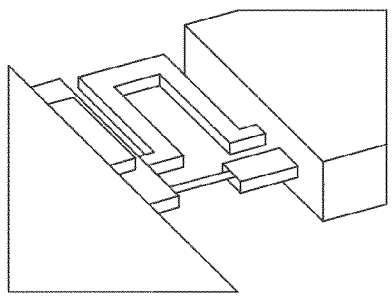
FIGS. 6A to 6F illustrate several configurations of a conductive enclosure between the host system and the radio module according to embodiments of the invention.
Figure 6A:
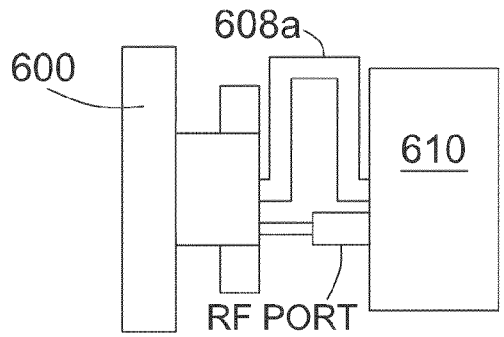
Figure 6B:
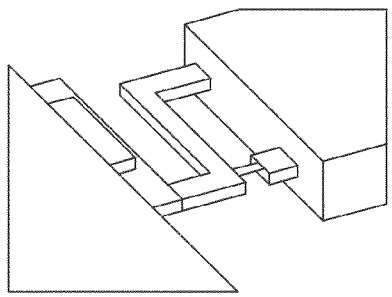
Figure 6B:
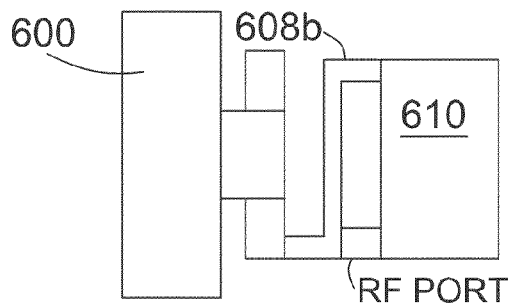
Figure 6C:
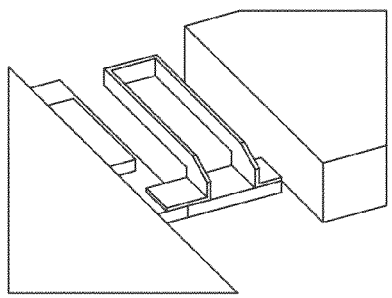
Figure 6C:
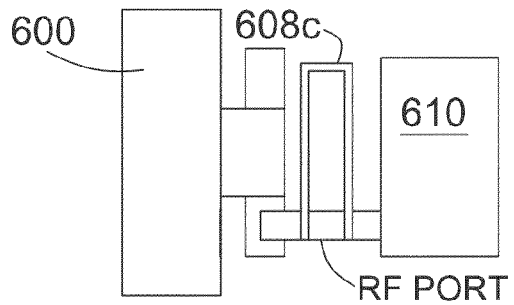
Figure 6D:
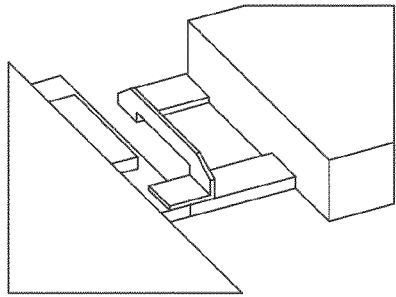
Figure 6D:
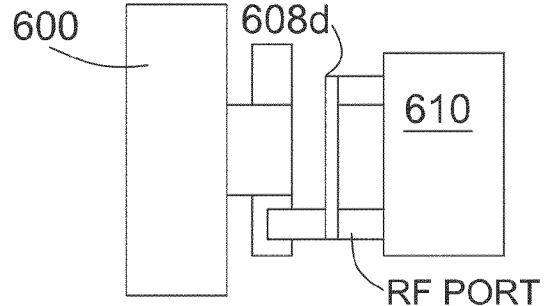
Figure 6E:
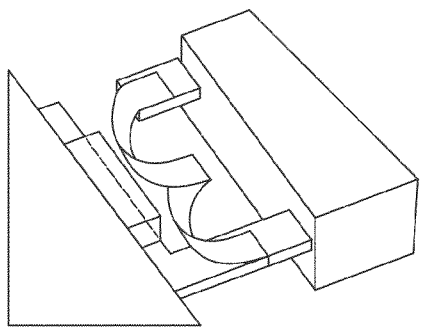
Figure 6E:
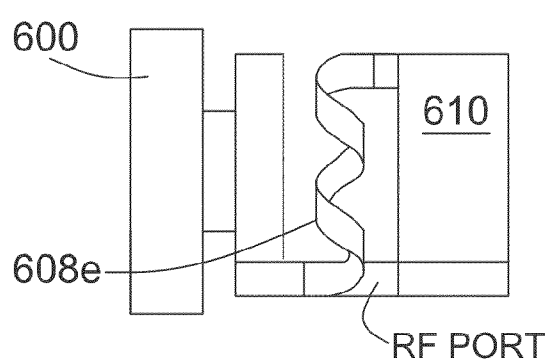

In some embodiments, the coupling element is further configured to conduct heat between the radio communication apparatus and the host system. This can facilitate operation of radio communication apparatus by providing heat sinking capabilities for the radio module. For example, the conductive enclosure can be configured to conduct heat, or the coupling element can include an additional material that is not electrically conductive but provides thermal conduction or heat transfer. Testing has indicated that there is little degradation in performance due to the inclusion of heat transfer material in the coupling body. In addition, there is a direct correspondence between the width of the coupling element, and the capacity for heat transfer of the coupling element. For example, in one embodiment, the smaller the gap between the radio electronics and a USB connector, the better will be the heat transfer between the two. In some embodiments, therefore, the selection of a narrower coupling element, for example as facilitated by the conductive enclosures 608b, 608*d* and 608*f* as illustrated in FIGS. 6B, 6D and 6F, respectively, can be desirable to increase heat transfer between the radio module and the host system.

Figure 6F:
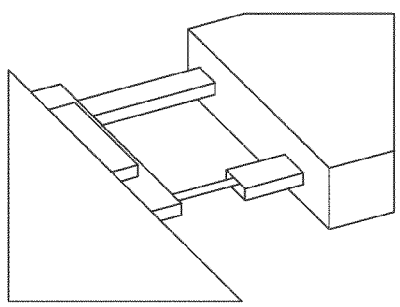
Figure 6F:
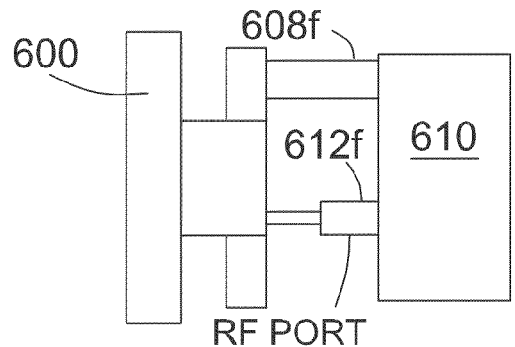
Figure 7:
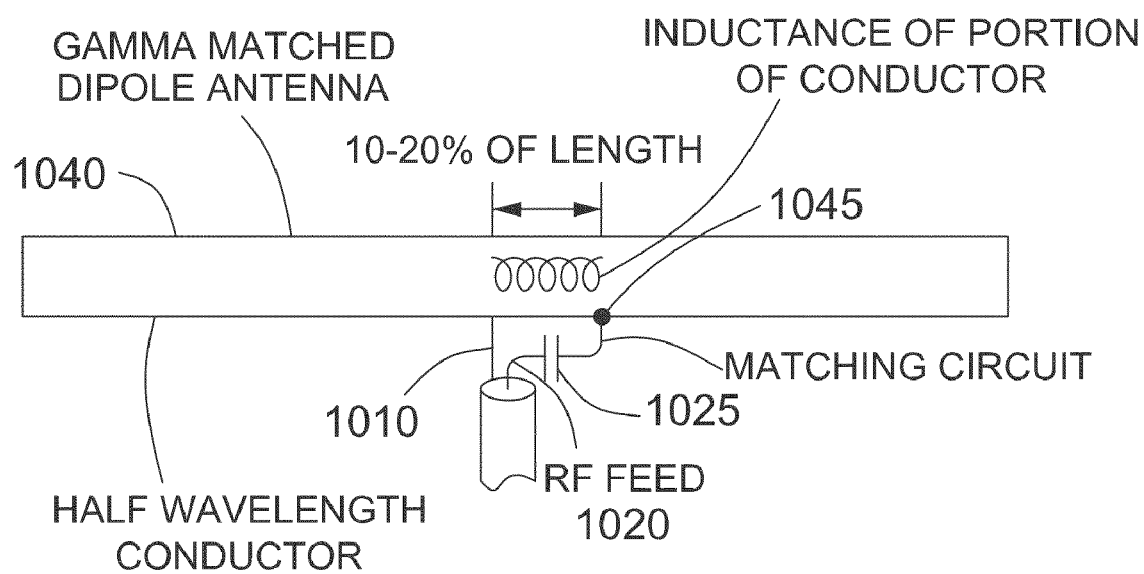
FIG. 7 illustrates a prior art gamma matched dipole antenna.

FIG. 6F illustrates a direct or substantially straight conductive enclosure portion 608*f* and antenna matching circuit and/or RF port 612*f* providing a desired electrical impedance for coupling the radio electromagnetic body and host electromagnetic body. In operation, the direct conductive enclosure portion 608*f* and antenna matching circuit or port 612*f* can facilitate impedance of undesired electromagnetic coupling via the conductive enclosure in a manner similar to that of a gamma matched dipole antenna, for example as illustrated in FIG. 7. As illustrated, a transmission line comprising a ground portion 1010 and a feed portion 1020 are coupled to the dipole 1040. The ground portion 1010 is connected to the dipole antenna 1040 at its center, while the feed portion 1020 is connected to the dipole antenna 1040 at connection point 1045 which is offset from the dipole center by 10% to 20% of the dipole length. The feed portion may be connected via a matching circuit 1025. The inductance of the portion of the dipole 1040 between its center and connection point 1045 enables a voltage to be generated between these two points for coupling to the transmission line. In FIG. 6F, the direct conductive enclosure portion 608*f* operates analogously to the gamma match ground portion 1010, while the matching circuit or port 612*f* is offset from the ground connection analogously to the offsetting of the gamma match feed portion 1020. That is, the direct conductive enclosure portion 608*f* attached to the radiating body 610 provides an inductance which facilitates antenna operation, simultaneously impeding undesired electromagnetic coupling between the radio electromagnetic body and the host electromagnetic body via the conductive enclosure portion 608*f*, and facilitating a desired electromagnetic coupling therebetween. Moving the locations of conductive enclosure portion 608*f* and antenna matching circuit or port 612*f* can be performed to adjust this impedance if desired, as would readily be understood by a worker skilled in the art.

Figure 8A:
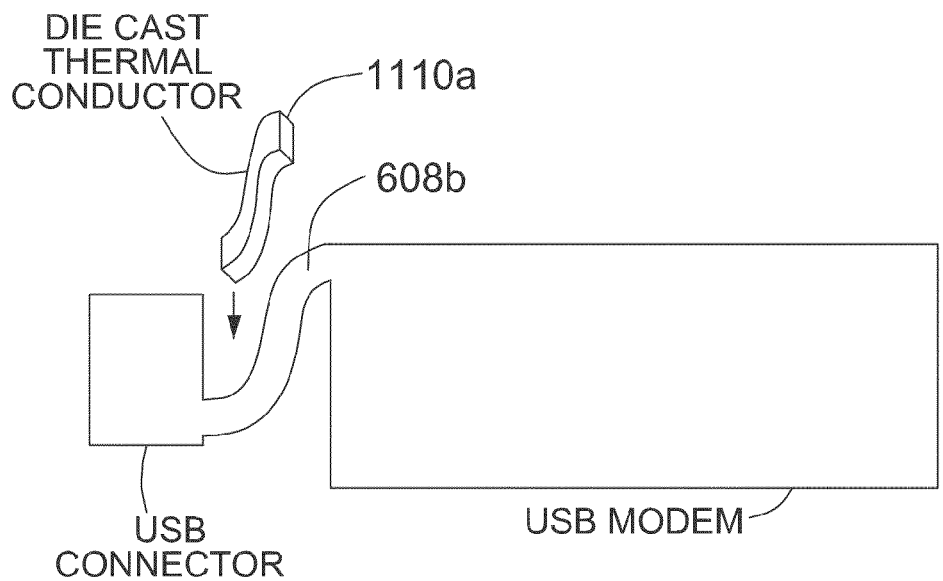
FIGS. 8A and 8B illustrate thermally conductive elements provided for a radio communication apparatus in accordance with embodiments of the present invention.
Figure 8B:
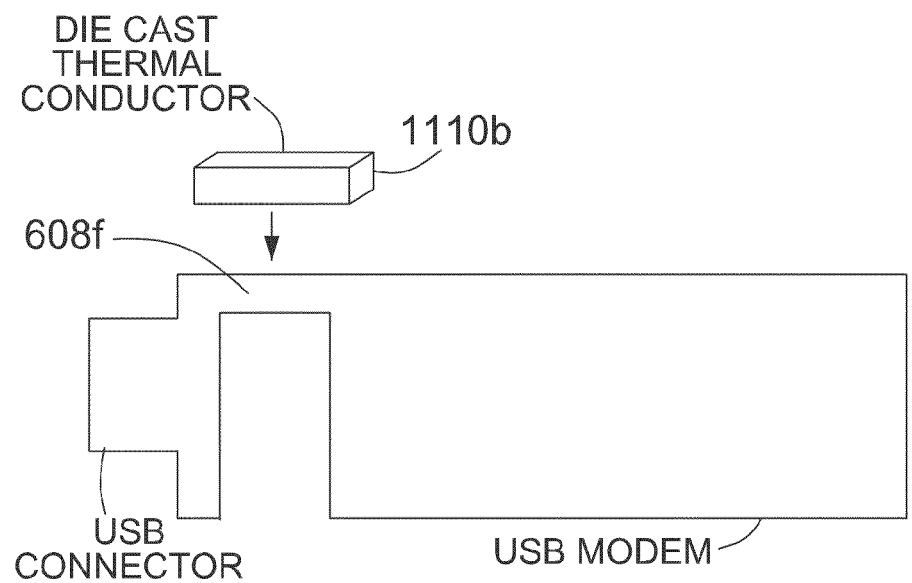

In some embodiments, heat conduction can be facilitated by soldering or otherwise attaching a thermally conductive element to the conductive enclosure. For example, thermally conductive elements made of copper or aluminum alloy can be provided, either formed by die-casting, extrusion, or other methods. In one embodiment, a thermally conductive grease, paste or adhesive can be applied between the thermally conductive element and the conductive enclosure to facilitate heat transfer. For example, FIGS. 8A and 8B illustrate die-cast or other thermally conductive elements 1110A and 1110B for attachment to conductive enclosures 608B and 608F, respectively.

Example 5

FIGS. 9A to 9F illustrate potential configurations for providing an antenna such as a secondary or diversity antenna according to the present invention. The illustrated antennas can be provided within a larger radio electromagnetic body 710, which may also operate as an antenna. FIGS. 9A to 9D illustrate several examples of how a notch antenna can be integrated into the radio electromagnetic body 710 of the radio module. A slot antenna would be implemented similarly, except that the radio electromagnetic body 710 would enclose the slot substantially on four sides. The notch antenna is operatively coupled to the radio electronics system (not shown) at the antenna feedpoint 725, which can also include an impedance matching circuit for the notch antenna.

Figure 9:
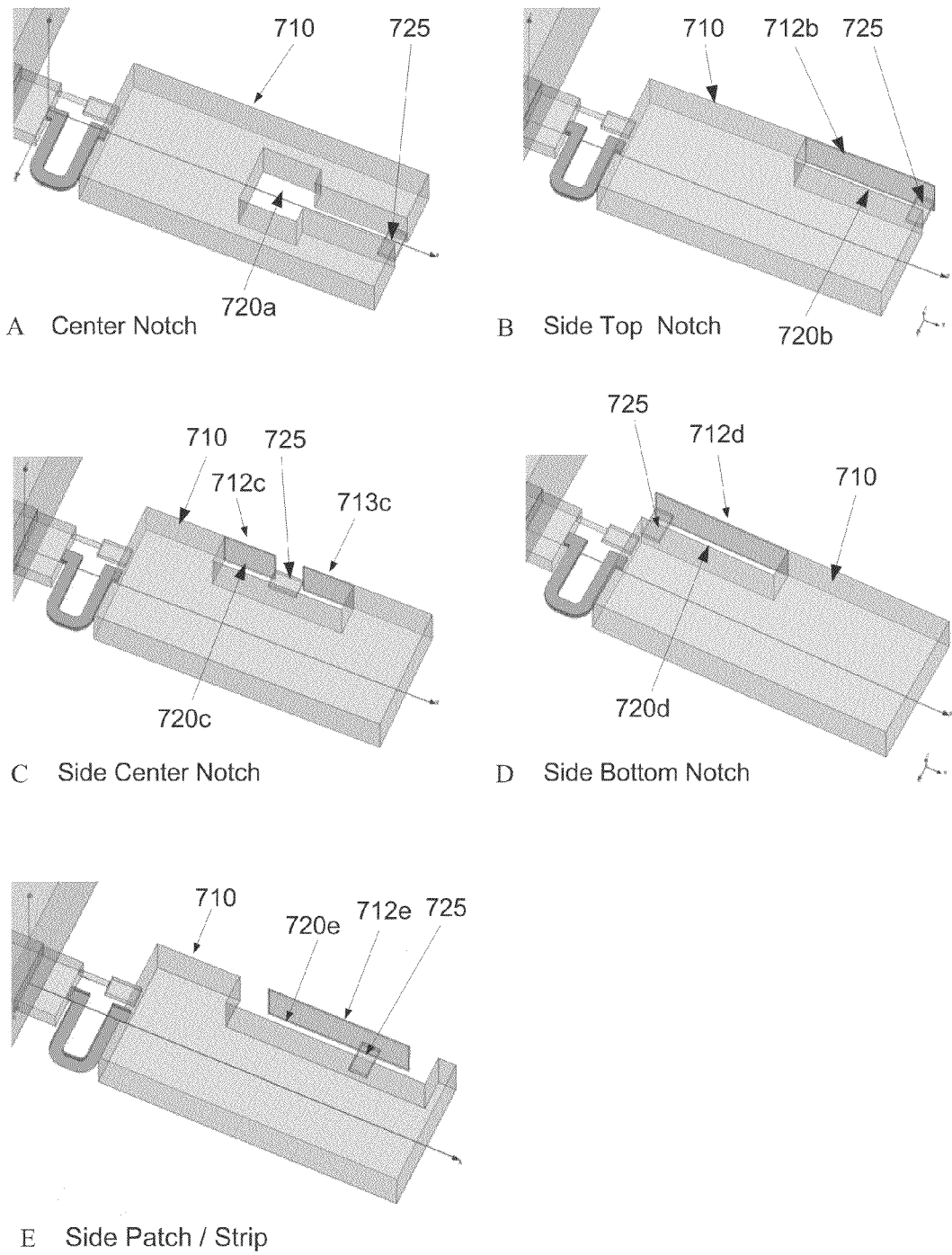
FIGS. 9A to 9H illustrate several configurations of an additional antenna of the radio module according to several embodiments of the invention.

FIG. 9A illustrates a notch antenna 720*a* that is nominally centered in the radio electromagnetic body 710 as shown. This configuration produces an electromagnetic field of the notch antenna 720*a* having a polarization substantially perpendicular to that due to that of the radio electromagnetic body 710 referenced to the host ground, thereby facilitating polarization diversity.

FIG. 9B illustrates a notch antenna 720*b* located on one side of the radio electromagnetic body 710. While the notch antenna 720*b* may not be as well isolated from the radio electromagnetic body 710 as notch antenna 720*a* is, it is functional as a diversity antenna solution, for example using polarization diversity, and can allow for a large area for layout of the radio electronics. A further advantage of this design is that the electromagnetic shielding wall only uses half the width that the first style would require. Additionally the thin nature of the portion 712*b* of the radio electromagnetic body 710 permits the portion 712*b* to be constructed using sheet metal, PCB, Flexible PCB, formed as part or the radio electromagnetic body 710 or other material as would be readily understood by a worker skilled in the art.

FIG. 9C illustrates a notch antenna 720*c* that can be considered to be either a notch or a slot excited nominally in the middle, though offset feeds are also possible. This notch antenna 720*c* can have an electromagnetic field that is substantially co-polarized with the radio electromagnetic body 710, but other methods, such as modal diversity, can be used to achieve isolation. Additionally the thin nature of the portions 712*c* and 713*c* of the radio electromagnetic body 710 can permit the portions 712*c* and 713*c* to be constructed using sheet metal, PCB, Flexible PCB or the like.

FIG. 9D illustrates a notch antenna 720*d* having sufficient isolation from the antenna of the radio electromagnetic body to facilitate a diversity antenna system. This design can be used to accommodate layout or mechanical constraints. The notch antenna 720*d* is similar to the notch antenna 720*b* except that the opening is at the opposite end. Due to the proximity of the opening to the main antenna feed, antenna isolation may differ substantially from the configuration illustrated in FIG. 7B.

FIG. 9E illustrates a side patch or strip antenna 720*e* near a side of the radio electromagnetic body 710. The strip antenna 720*e* is open at two points of the radio electromagnetic body 710, thereby defining a portion 712*e* which can be substantially separated from the radio electromagnetic body 710 by the strip antenna 720*e*. This strip antenna acts as a top loaded monopole as referenced to the radio electromagnetic body 710. The antenna feedpoint 725 is coupled to the portion 712*e*. However, for functional description in one embodiment, the portion 712*e* can still be considered a part of the radio electromagnetic body 710. The strip antenna 720*e* typically has a polarization substantially perpendicular to that of the radio electromagnetic body 710 as referenced to the host ground plane, thereby facilitating polarization diversity. Additionally the thin nature of the portion 712*e* permits it to be constructed using sheet metal, PCB, Flexible PCB or other material as would be readily understood by a worker skilled in the art.

Figure 9F:
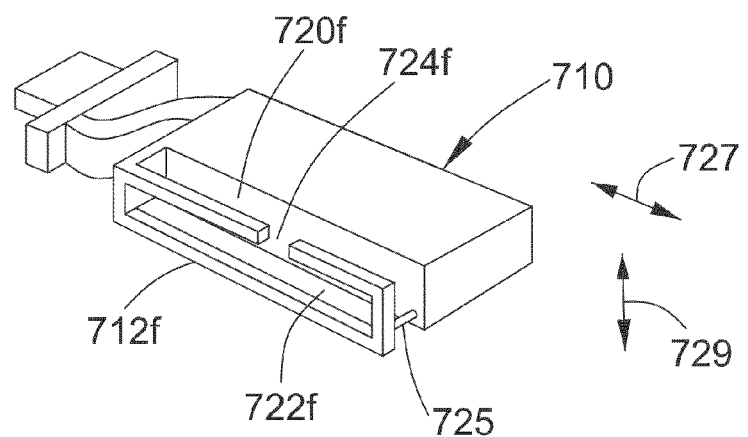

FIG. 9F illustrates a notch antenna 720*f* near a side of the radio electromagnetic body 710 according to another embodiment of the present invention. The antenna 720*f* includes a notch between a main portion of the radio electromagnetic body 710 and a portion 712*f*. In this respect, the antenna 720*f* is similar to the antenna 720*b* except possibly for the depth of the notch, which may be varied in either case. An antenna feedpoint 725 is provided for the notch antenna 720*f*, coupled to the portion 712*f* and to associated electronics via a transmission line. The portion 712f body resembles a substantially "C"-shaped body, having an outer perimeter defining a cavity 722f with an opening 724f. In one embodiment, with the radio electromagnetic body 710 providing a first antenna having a first polarization 727 and the notch antenna 720f providing a second antenna having a second polarization 729, a diversity antenna solution having at least polarization diversity can be provided.

Figure 9G:
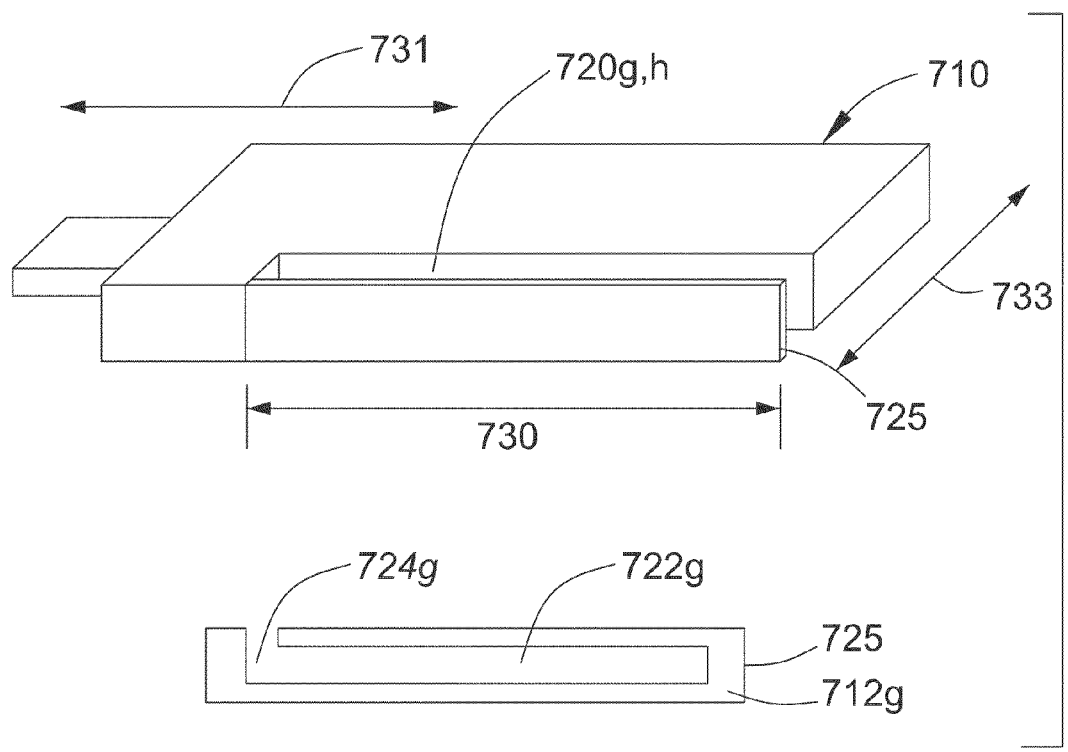

FIG. 9G illustrates a notch antenna 720g near a side of the radio electromagnetic body 710 according to another embodiment of the present invention. The antenna 720g includes a notch between a main portion of the radio electromagnetic body 710 and a portion 712g. An antenna feedpoint 725 is provided for the notch antenna 720g, coupled to the portion 712g and to associated electronics via a transmission line. The portion 712g body has an outer perimeter defining a cavity 722g with an opening 724g near one end of the cavity. In one embodiment, with the radio electromagnetic body 710 providing a first antenna and the notch antenna 720g providing a second antenna, a diversity antenna solution can be provided.

Figure 9H:
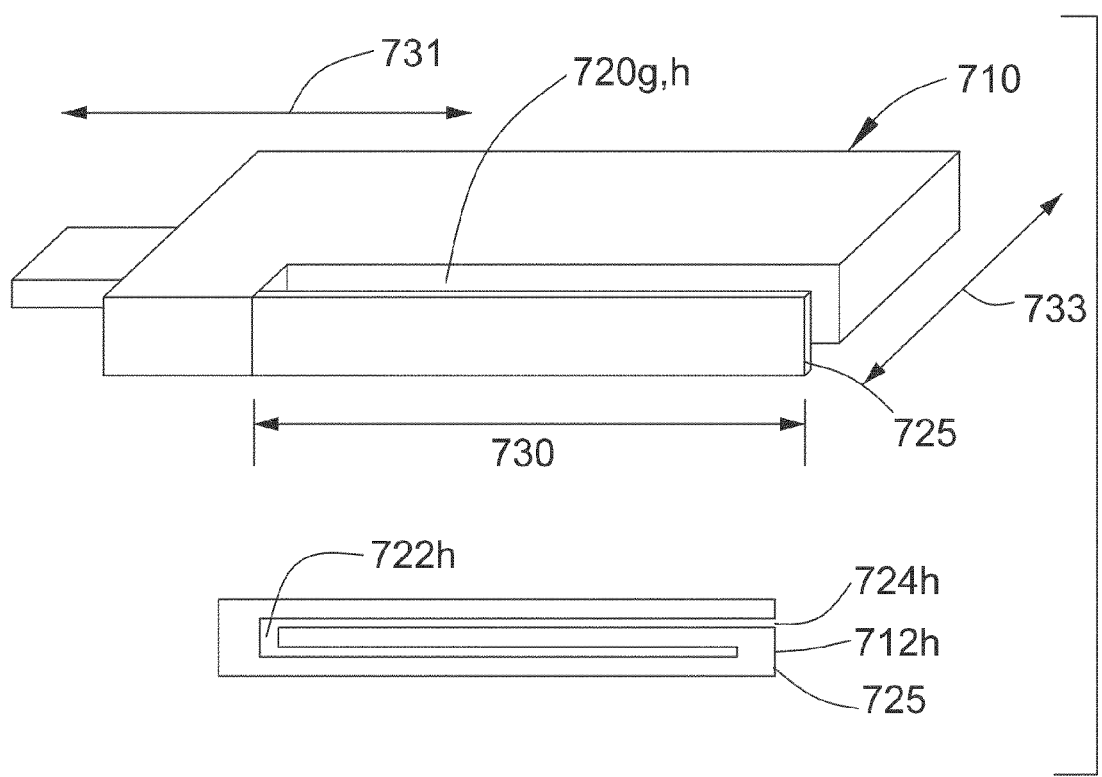

FIG. 9H illustrates a notch antenna 720h near a side of the radio electromagnetic body 710 according to another embodiment of the present invention. The antenna 720h includes a notch between a main portion of the radio electromagnetic body 710 and a portion 712h. An antenna feedpoint 725 is provided for the notch antenna 720h, coupled to the portion 712h and to associated electronics via a transmission line. The portion 712h body has an outer perimeter defining a spiral-shaped cavity 722h with an opening 724h near the feedpoint 725. This configuration resembles a spiral and/or PIFA antenna. In one embodiment, with the radio electromagnetic body 710 providing a first antenna and the notch antenna 720h providing a second antenna, a diversity antenna solution can be provided.

Embodiments of the antennas illustrated in FIGS. 9G and 9H may share similarities to PIFA antennas as known in the art, such as similarities with respect to modal excitation and/or modal diversity. For example, for PIFA antennas, the distance between antenna ground and feedpoint is typically less than one tenth of an operating wavelength. For FIGS. 9G and 9H, the distance 730 may be of this order when operating in the 900 MHz band in some embodiments. In a higher operating band, for example between 1800 MHz and 2200 MHz, the distance 730 may then be substantially one quarter of an operating wavelength. This enables increased bandwidth in the higher operating band when the antenna 720g or 720h operates in the transverse mode, which has an excitation 733 at substantially a right angle to the main or longitudinal mode excitation 731, thereby providing modal diversity.

Example 6

Figure 10:
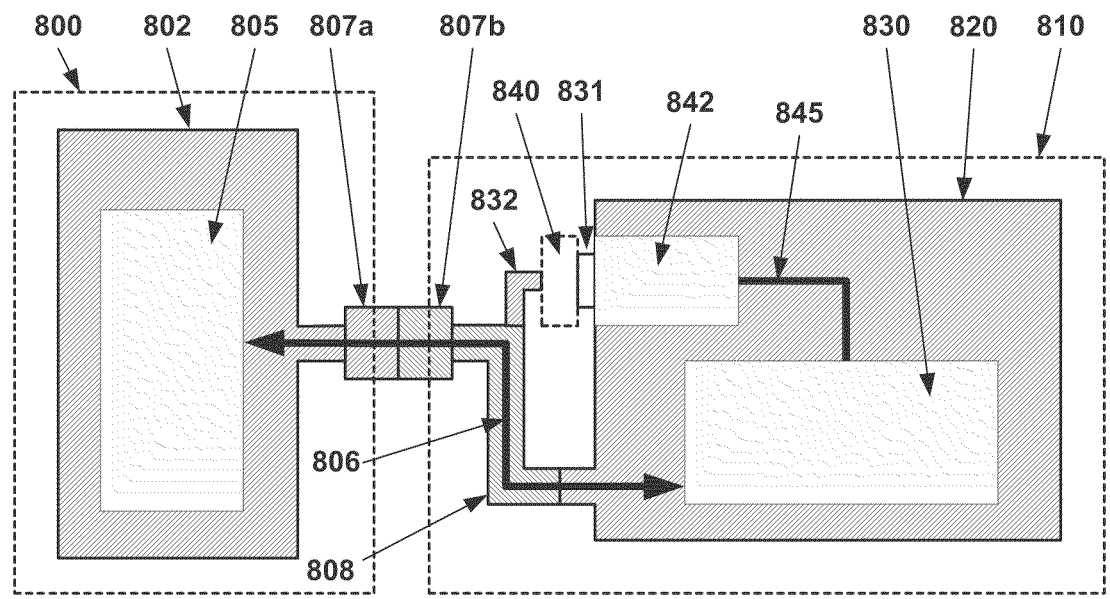
FIG. 10 illustrates a radio module coupled to a host system according to one embodiment of the present invention.

FIG. 10 illustrates in detail an inclusive antenna element or apparatus body 810 coupled to a host system 800, according to one embodiment of the present invention. Radio system components highlighted in this example include a host electromagnetic body or ground plane 802 which may enclose an electronics system 805, a radio module including a radio electromagnetic body 820, and a radio electronics system 830, including RF radio electronics 842 and system electronics, a USB connection means 807a and 807b, including two mating USB connectors, an RF isolation means or wave trap 808 that provides for a sufficient voltage drop to drive the antenna formed from 802 and 820, or otherwise impeded undesired electromagnetic coupling via the conductive enclosure, and a connection means including a conductor 832, a matching circuit 840 and a transmission line 831. The connection means bridges across the RF isolation means or wave trap 808 and interconnects to the radio electronics system of the radio module; in particular to an RF transceiver incorporated into the RF radio electronics 842.

The electronics system 805 and the radio electronics system 830 communicate and interconnect via the wires or conductive traces or electronics pathway 806 that are contained within the shielding system or conductive enclosure formed by the shielding surfaces 802, 807a, 807b, 808 and 820. This shielding prevents unwanted signals and or noise from radiating out into free space or from coupling into the RF feed system that connects to the RF radio contained within the radio shield 842. The RF radio electronics 842 in turn communicates through internal isolated means to the radio electronics system 830 via path 845.

In some embodiments, substantially all electromagnetic activity associated with radio operation, such as radiating currents, in the present example are only present externally on the shielded surfaces 802, 807a, 807b, 808 and 820, while substantially all interconnecting signals and their associated currents only operate within these shielded surfaces and are not intended to leak to the outside surfaces.

An exception to the isolation of electronics signals and radiating currents is that the voltage drop across the connection means 832, 840 and 831 may couple into the RF radio through an intentional hole in the radiating surface 820. The connection means may be via a transmission line such as a stripline, microstrip line, a coaxial connection or other such means as would be understood by a worker skilled in the art.

Figure 11:
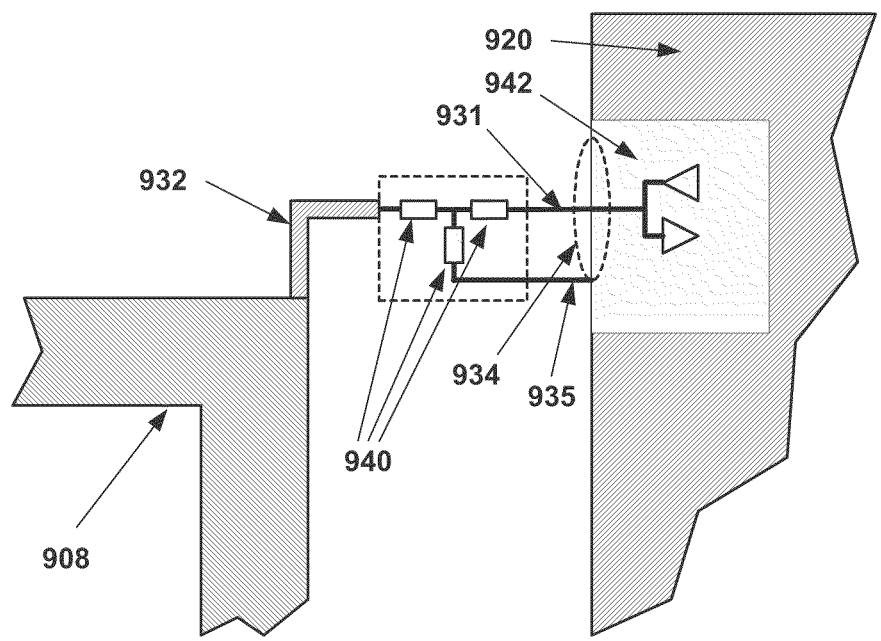
FIG. 11 illustrates a detailed view of the coupling of FIG. 10 according to one embodiment of the present invention.

FIG. 11 illustrates in detail the coupling concept for an RF radio according to one embodiment of the present invention, for example as illustrated in FIG. 10 with reference to labelled components 832, 840, 831, and 842. In particular, a signal can be developed across the inductive path of the isolator or wave trap 908 (corresponding to isolator or wave trap 808 in FIG. 10) and the radio electromagnetic body 920, and/or sensed across a coupling mechanism which includes a conductor 932, matching components 940, a conductor 931 which is referenced to a "ground attachment" 935, which connects through a coaxial entry point 934 to RF radio electronics 942. The portion of the radio shield system 920 between the "ground reference point" 935 and the point of attachment of the isolator 908 to the radio shield system 920 (illustrated in FIG. 10 as an attachment between isolator 808 and radio shield system 820) also contributes to the inductance of the isolator 908 and goes to further increase the signal developed at the feed point 931.

Whenever a conductor passes from a device inside a shield to outside the shield, as illustrated above, radiation and reception may occur into or from free space. Consequently it can be desirable to bypass and internally shield such devices to prevent unwanted signal or noise from passing to or from these devices.

Example 7

Figure 12:
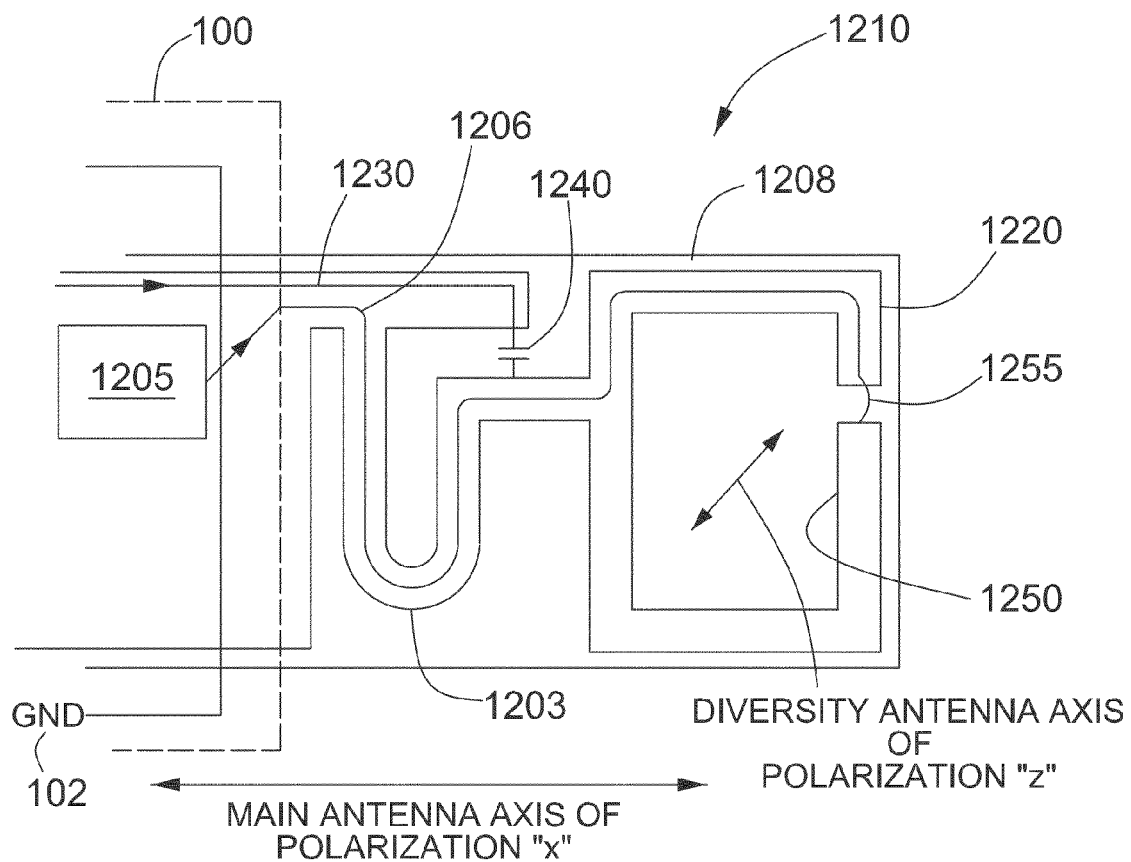
FIG. 12 illustrates a radio communication apparatus coupled to a host system in accordance with another embodiment of the invention.
Figure 12:
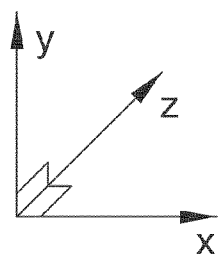

FIG. 12 illustrates a radio communication apparatus 1210 coupled to a host system 100 according to another embodiment of the present invention. For example, the radio communication apparatus 1210 can be provided using a PCI, PCMCIA, Express card or other interface that can be inserted into a slot in a host system 100. In this manner, at least a portion of the electronics of a wireless adapter can be contained within a slot of the host system and thus do not need to be provided inside the radio module or radio electromagnetic body thereof as in FIG. 1, for example. The radio communication apparatus 1210 comprises an electronics system 1205 operatively coupled to the host system 100 and to a first radio electromagnetic body 1220 and a second radio electromagnetic body 1250. In the present example, the first radio electromagnetic body 1220 and the host electromagnetic body 102 comprise a first antenna such as a monopole antenna. The second radio electromagnetic body 1250 is provided as a slot or notch within the first radio electromagnetic body 1220.

Referring to FIG. 12, rather than the signal pathway 1206 providing an electronics pathway coupling the electronics system 1205 to a radio electronics system, the signal pathway 1206 provides a transmission line coupling the electronics system 1205 to the second radio electromagnetic body 1250 at an antenna feedpoint 1255, which may also comprise an antenna matching element. The signal pathway 1206 is provided within a conductive enclosure 1203 and may provide electromagnetic isolation between the signal pathway 1206 and the first antenna and/or first antenna feed 1208. The conductive enclosure 1203 is also configured, for example with a "U" shaped portion, to at least partially impede undesired electromagnetic coupling between the host electromagnetic body 102 and at least one of the first radio electromagnetic body 1220 and the second radio electromagnetic body 1250. The electronics system 1205 is operatively coupled to the first radio electromagnetic body 1220 via a transmission path 1230 and matching element 1240 providing an electromagnetic and/or current path having a desired impedance.

Figure 13A:
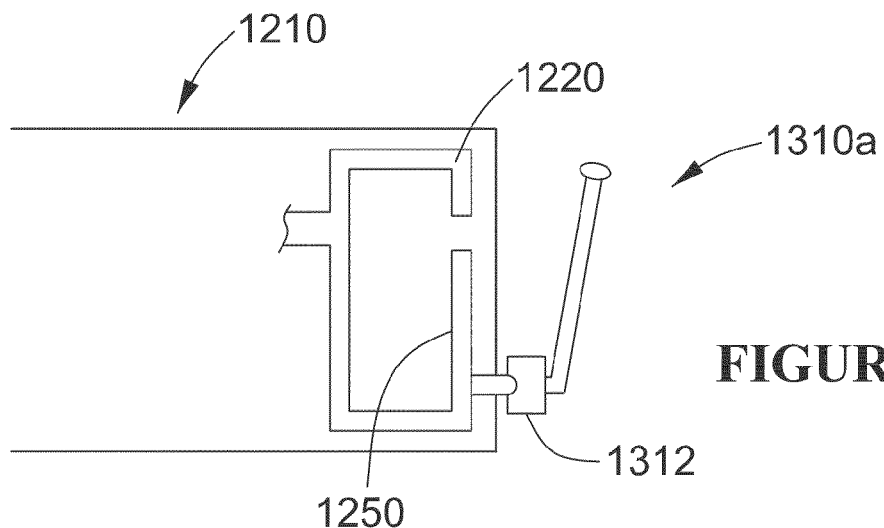
FIGS. 13A to 13C illustrate fold-out antenna elements coupled to the radio communication apparatus in accordance with embodiments of the present invention.
Figure 13B:
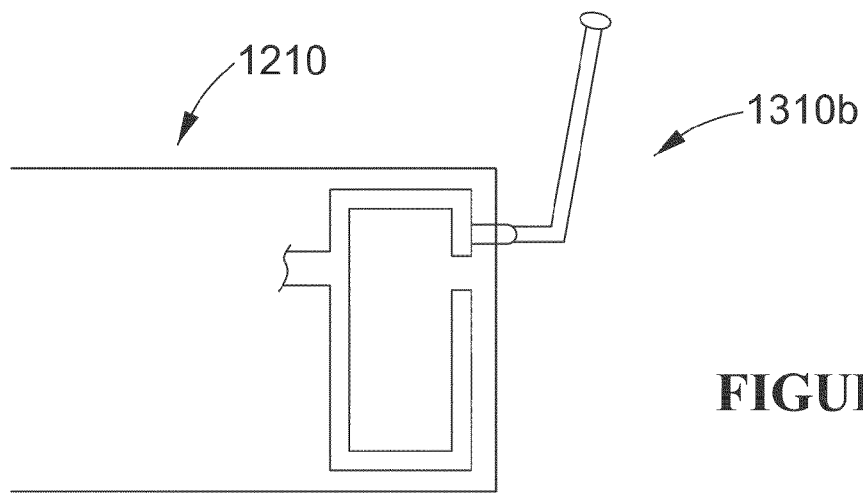
Figure 13C:
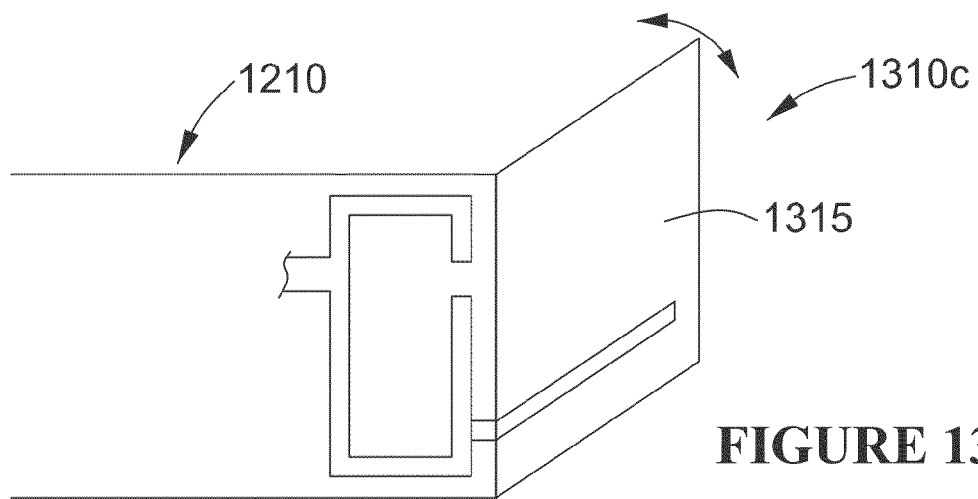

FIGS. 13A to 13C illustrate additional fold-out antenna elements 1310*a*, 1310*b*, 1310*c*, provided according to embodiments of the present invention and operatively coupled to the radio communication apparatus. The additional elements are here illustrated as additional elements for use with the radio communication apparatus illustrated in FIG. 12, however similar features may be provided for in other embodiments of the present invention. Adding an additional fold-out antenna element may alter the characteristics of the provided antennas, for example increasing the bandwidth of the main and/or diversity antenna. Fold-out antenna elements may be provided as flexible or rigid conductors, such as wires, conductive strips or panels, or the like.

FIG. 13A illustrates a fold-out antenna element 1310*a*, which can be removably coupled to the radio communication apparatus 1210 via a connector 1312. FIG. 13B illustrates a foldable antenna element 1310*b*, which can be swivelled or rotated in a desired direction. FIG. 13C illustrates a panel 1315 having an antenna element 1310*c*, for example provided as a wire or circuit trace on the panel 1315. In one embodiment, the panel 1315 may be folded over the main portion of the radio communication apparatus for compactness, and folded out during operation. In a further embodiment, the panel 1315 may be spring-loaded for example so that the action of inserting the radio communication apparatus into the host system triggers the panel 1315 to fold out by releasing a catch.

It is obvious that the foregoing embodiments of the invention are examples and can be varied in many ways. Such present or future variations are not to be regarded as a departure from the spirit and scope of the invention, and all such modifications as would be obvious to one skilled in the art are intended to be included within the scope of the following claims.

We claim:

1. A radio communication apparatus for use with a host system, the host system including a host electromagnetic body, the apparatus comprising:
    a) an electronics system operatively coupled to the host system;
    b) a radio module including a radio electromagnetic body;
    c) a signal pathway operatively coupling the electronics system with the radio module; and
    d) a conductive enclosure configured to provide electromagnetic isolation between the signal pathway and the radio electromagnetic body, the conductive enclosure further configured to at least partially impede electromagnetic coupling between the radio electromagnetic body and the host electromagnetic body,
    wherein the radiating body and the host electromagnetic body form a monopole antenna or a dipole antenna.

2. The radio communication apparatus of claim 1, wherein the radio module further comprises a radio electronics system, the radio electronics system operatively coupled to the signal pathway and to the radio electromagnetic body.

3. The radio communication apparatus of claim 2, wherein the radio electronics system is configured for use with the radio electromagnetic body for radio communication.

4. The radio communication apparatus of claim 1, wherein at least a portion of the signal pathway includes a USB interface.

5. The radio communication apparatus of claim 2, further comprising shielding between the electronics system and the radio electromagnetic body and wherein the radio electronics system is inside at least a portion of the radio electromagnetic body.

6. The radio communication apparatus of claim 1, wherein the electronics system is integral to the host system.

7. The radio communication apparatus of claim 1, wherein the electronics system is removable from the host system.

8. A radio communication apparatus for use with a host system, the host system including a host electromagnetic body, the apparatus comprising:
    a) an electronics system operatively coupled to the host system;
    b) a radio module including a radio electromagnetic body;
    c) a signal pathway operatively coupling the electronics system with the radio module; and
    d) a conductive enclosure configured to provide electromagnetic isolation between the signal pathway and the radio electromagnetic body, the conductive enclosure further configured to at least partially impede electromagnetic coupling between the radio electromagnetic body and the host electromagnetic body,
    wherein the radio module further comprises a second radio electromagnetic body, the second radio electromagnetic body operatively coupled to the signal pathway.

9. A radio communication apparatus for use with a host system, the host system including a host electromagnetic body, the apparatus comprising:
    a) an electronics system operatively coupled to the host system;
    b) a radio module including a radio electromagnetic body;
    c) a signal pathway operatively coupling the electronics system with the radio module; and
    d) a conductive enclosure configured to provide electromagnetic isolation between the signal pathway and the radio electromagnetic body, the conductive enclosure further configured to at least partially impede electromagnetic coupling between the radio electromagnetic body and the host electromagnetic body,
    wherein the radiating body and the host electromagnetic body form a monopole antenna.

10. The radio communication apparatus of claim 9, wherein the monopole antenna is an Ultra Wide Band antenna.

11. A radio communication apparatus for use with a host system, the host system including a host electromagnetic body, the apparatus comprising:
a) an electronics system operatively coupled to the host system;
b) a radio module including a radio electromagnetic body;
c) a signal pathway operatively coupling the electronics system with the radio module; and
d) a conductive enclosure configured to provide electromagnetic isolation between the signal pathway and the radio electromagnetic body, the conductive enclosure further configured to at least partially impede electromagnetic coupling between the radio electromagnetic body and the host electromagnetic body,
the apparatus further comprising additional radiating bodies for formation of a multiple antenna system.

12. The radio communication apparatus of claim 11, wherein the multiple antenna system facilitates a diversity antenna system.

13. The radio communication apparatus of claim 11, wherein the multiple antenna system includes one or more antennas selected from the group comprising: notch antennas, slot antennas, patch antennas and strip antennas.

14. The radio communication apparatus of claim 11, wherein at least a portion of the additional radiating bodies are incorporated into the radio electromagnetic body.

15. A radio communication apparatus for use with a host system, the host system including a host electromagnetic body, the apparatus comprising:
a) an electronics system operatively coupled to the host system;
b) a radio module including a radio electromagnetic body;
c) a signal pathway operatively coupling the electronics system with the radio module; and
d) a conductive enclosure configured to provide electromagnetic isolation between the signal pathway and the radio electromagnetic body, the conductive enclosure further configured to at least partially impede electromagnetic coupling between the radio electromagnetic body and the host electromagnetic body,
the apparatus further comprising a coupling between the radio electromagnetic body and the host electromagnetic body, at least a portion of the coupling bridging at least a portion of the conductive enclosure.

16. The radio communication apparatus of claim 15, wherein the coupling is configured with a predetermined impedance.

17. The radio communication apparatus of claim 1, wherein the electronics system is configured for use with the radio electromagnetic body for radio communication.

18. The radio communication apparatus of claim 1, wherein the host system is a personal computer.

19. The radio communication apparatus of claim 18, wherein a portion of the radio communication apparatus is configured for insertion into an interface slot of the personal computer.

20. The radio communication apparatus of claim 1, wherein the host system is a portion of a handheld device.

21. A radio communication apparatus for use with a host system, the host system including a host electromagnetic body, the apparatus comprising:
a) an electronics system operatively coupled to the host system;
b) a radio module including a radio electromagnetic body;
c) a signal pathway operatively coupling the electronics system with the radio module; and
d) a conductive enclosure configured to provide electromagnetic isolation between the signal pathway and the radio electromagnetic body, the conductive enclosure further configured to at least partially impede electromagnetic coupling between the radio electromagnetic body and the host electromagnetic body,
wherein the conductive enclosure comprises a wave trap.

22. The radio communication apparatus of claim 21, wherein the wave trap is selected from the group comprising: "U" shaped wave traps, "S" shaped wave traps, direct wave traps, and helically shaped wave traps.

23. A radio communication apparatus for use with a host system, the host system including a host electromagnetic body, the apparatus comprising:
a) an electronics system operatively coupled to the host system;
b) a radio module including a radio electromagnetic body;
c) a signal pathway operatively coupling the electronics system with the radio module; and
d) a conductive enclosure configured to provide electromagnetic isolation between the signal pathway and the radio electromagnetic body, the conductive enclosure further configured to at least partially impede electromagnetic coupling between the radio electromagnetic body and the host electromagnetic body,
the apparatus further comprising a thermally conductive element coupled to the conductive enclosure.

24. The radio communication apparatus of claim 1, wherein the host electromagnetic body operates as a complementary radiating body, ground element, or counterpoise to the radio electromagnetic body.

25. A radio communication apparatus for use with a host system, the host system including a host electromagnetic body and a host electronics system, the apparatus comprising:
a) a radio module including a radio electromagnetic body;
b) a signal pathway operatively coupling the host electronics system with the radio module; and
c) a conductive enclosure configured to provide electromagnetic isolation between the signal pathway and the radio electromagnetic body, the conductive enclosure further configured to at least partially impede electromagnetic coupling between the radio electromagnetic body and the host electromagnetic body,
wherein the radiating body and the host electromagnetic body form a monopole antenna or a dipole antenna.

26. The radio communication apparatus of claim 25, wherein the radio module further comprises a radio electronics system, the radio electronics system operatively coupled to the signal pathway and to the radio electromagnetic body.

27. The radio communication apparatus of claim 26, further comprising shielding between the radio electronics system and the radio electromagnetic body and wherein the radio electronics system is inside at least a portion of the radio electromagnetic body.

28. The radio communication apparatus of claim 25, wherein the radiating body and the host electromagnetic body form a monopole antenna.

29. The radio communication apparatus of claim 25, further comprising a coupling between the radio electromagnetic body and the host electromagnetic body, at least a portion of the coupling bridging at least a portion of the conductive enclosure.

30. The radio communication apparatus of claim 25, wherein the conductive enclosure comprises a wave trap.

31. The radio communication apparatus of claim 25, wherein the host electromagnetic body operates as a complementary radiating body, ground element, or counterpoise to the radio electromagnetic body.

* * * * *